(12) United States Patent
Otsubo et al.

(10) Patent No.: US 10,410,782 B2
(45) Date of Patent: Sep. 10, 2019

(54) COIL MODULE

(71) Applicant: Murata Manufacturing Co., Ltd., Kyoto (JP)

(72) Inventors: Yoshihito Otsubo, Kyoto (JP); Norio Sakai, Kyoto (JP); Mitsuyoshi Nishide, Kyoto (JP); Shinichiro Banba, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 312 days.

(21) Appl. No.: 15/276,888

(22) Filed: Sep. 27, 2016

(65) Prior Publication Data
US 2017/0018349 A1 Jan. 19, 2017

Related U.S. Application Data

(63) Continuation of application No. PCT/JP2015/058008, filed on Mar. 18, 2015.

(30) Foreign Application Priority Data

Mar. 28, 2014 (JP) .................. 2014-069063

(51) Int. Cl.
*H01F 27/24* (2006.01)
*H01F 27/28* (2006.01)
(Continued)

(52) U.S. Cl.
CPC ..... *H01F 27/2804* (2013.01); *H01F 17/0033* (2013.01); *H01F 17/062* (2013.01);
(Continued)

(58) Field of Classification Search
CPC ............ H01F 5/00; H01F 27/00-36
(Continued)

(56) References Cited

U.S. PATENT DOCUMENTS 6,148,500 A * 11/2000 Krone ............... H01F 17/0033
29/602.1
7,821,374 B2 10/2010 Harrison et al.
(Continued)

FOREIGN PATENT DOCUMENTS

JP 2000-040620 A 2/2000
JP 2006-165212 A 6/2006
(Continued)

OTHER PUBLICATIONS

International Search Report for PCT/JP2015/058008 dated May 26, 2015.
Written Opinion for PCT/JP2015/058008 dated May 26, 2015.

*Primary Examiner* — Tuyen T Nguyen
(74) *Attorney, Agent, or Firm* — Pearne & Gordon LLP

(57) ABSTRACT

A coil component is provided with only first and second columnar conductors that are a part of a coil electrode. This can simplify the manufacturing process and reduce the cost of the coil component. A wiring substrate is provided with substrate-side wiring electrode traces that form the remaining part of the coil electrode. In the process of forming the wiring substrate using a substrate forming technique commonly used, the substrate-side wiring electrode traces can be easily formed together with other wiring electrodes. Therefore, when the coil electrode is configured to be formed by placing the coil component on the wiring substrate, a coil module including the coil component can be inexpensively manufactured.

20 Claims, 14 Drawing Sheets

(51) Int. Cl.
*H01F 17/00* (2006.01)
*H01F 17/06* (2006.01)
*H05K 1/18* (2006.01)

(52) U.S. Cl.
CPC ............... *H01F 27/24* (2013.01); *H05K 1/18* (2013.01); *H01F 2027/2809* (2013.01); *H01F 2027/2814* (2013.01); *H05K 1/181* (2013.01); *H05K 2201/083* (2013.01); *H05K 2201/1003* (2013.01); *H05K 2201/10545* (2013.01)

(58) Field of Classification Search
USPC ... 336/65, 83, 192, 200, 206–208, 225, 229, 336/232–234
See application file for complete search history.

(56) References Cited

U.S. PATENT DOCUMENTS

| | | | | |
|---|---|---|---|---|
| 7,982,572 B2 * | 7/2011 | Schaffer | .............. | H01F 17/0033 336/200 |
| 8,581,114 B2 * | 11/2013 | Harrison | ............. | H01F 17/0033 174/266 |
| 8,591,262 B2 * | 11/2013 | Schaffer | .................. | H01F 5/003 336/170 |
| 9,887,034 B2 * | 2/2018 | Francis | ............... | H01F 27/2895 |
| 10,158,293 B2 * | 12/2018 | Noma | ..................... | H01F 27/24 |
| 2006/0176139 A1 | 8/2006 | Pleskach et al. | | |
| 2015/0061817 A1 | 3/2015 | Lee et al. | | |

FOREIGN PATENT DOCUMENTS

| | | |
|---|---|---|
| JP | 2008-530799 A | 8/2008 |
| JP | 5270576 B2 | 8/2013 |
| JP | 2013-207126 A | 10/2013 |
| JP | 2013-207149 A | 10/2013 |
| JP | 2015-050459 A | 3/2015 |
| WO | 2008088682 A2 | 7/2008 |

* cited by examiner

-- PRIOR ART --

COIL MODULE

This application is a continuation of International Application No. PCT/JP2015/058008 filed on Mar. 18, 2015 which claims priority from Japanese Patent Application No. 2014-069063 filed on Mar. 28, 2014. The contents of these applications are incorporated herein by reference in their entireties.

BACKGROUND

Technical Field

The present disclosure relates to a coil module that includes a coil having a coil core and a coil electrode helically wound around the coil core.

Conventionally, as illustrated in FIG. 21, a coil component 500 having a transformer therein has been proposed. The coil component 500 includes a coil core 501 embedded in a resin insulating layer (not shown), a first coil electrode 502a forming a primary coil, and a second coil electrode 502b forming a secondary coil. The first coil electrode 502a includes first outside columnar conductors 503a arranged along the outer periphery of the coil core 501, and first inside columnar conductors 504a arranged along the inner periphery of the coil core 501. Similarly, the second coil electrode 502b includes second outside columnar conductors 503b arranged along the outer periphery of the coil core 501, and second inside columnar conductors 504b arranged along the inner periphery of the coil core 501.

A plurality of first wiring electrode traces 505a formed on both the principal surfaces of the resin insulating layer each connect the corresponding end portions of the first outside columnar conductor 503a and the first inside columnar conductor 504a to form the first coil electrode 502a helically wound around the coil core 501. Similarly, a plurality of second wiring electrode traces 505b formed on both the principal surfaces of the resin insulating layer each connect the corresponding end portions of the second outside columnar conductor 503b and the second inside columnar conductor 504b to form the second coil electrode 502b helically wound around the coil core 501.

The first and second coil electrodes 502a and 502b include primary and secondary coil electrode pairs 506a and 506b, respectively, and also include primary and secondary coil center taps 507a and 507b, respectively. In FIG. 21, the second wiring electrode traces 505b, the secondary coil electrode pair 506b, and the secondary coil center tap 507b forming the secondary coil are indicated by hatching.

Patent Document 1: Japanese Patent No. 5270576 (see, e.g., paragraphs [0044] to [0046], FIG. 3)

BRIEF SUMMARY

Mounting the coil component 500 on a wiring substrate (not shown) forms a coil module having various functions. In recent years, it has been required to reduce the cost of such a coil module.

The present disclosure has been made in view of the problem described above. The present disclosure provides a technique for inexpensively manufacturing a coil module, including a coil component, by simplifying the manufacturing process and reducing the cost of the coil component.

A coil module that includes a coil having a coil core and a coil electrode helically wound around the coil core according to the present disclosure includes a coil component including an insulating layer having the coil core embedded therein, and a component-side coil electrode provided in the insulating layer, forming a part of the coil electrode, and having a non-helical shape; and a wiring substrate having the coil component thereon and provided with a substrate-side coil electrode and other wiring electrodes, the substrate-side coil electrode forming the remaining part of the coil electrode and having a non-helical shape. The component-side coil electrode of the coil component is connected to the substrate-side coil electrode of the wiring substrate to helically form the coil electrode.

In the coil module configured as described above, the component-side coil electrode that forms a part of the helical portion of the coil electrode helically wound around the coil core to form the coil, the component-side coil electrode having a non-helical shape, is provided in the insulating layer having the coil core embedded therein in the coil component. At the same time, the substrate-side coil electrode and other wiring electrodes, the substrate-side coil electrode forming the remaining part of the helical portion of the coil electrode and having a non-helical shape, are provided in the wiring substrate. The coil component is disposed on the wiring substrate, and the component-side coil electrode of the coil component is connected to the substrate-side coil electrode of the wiring substrate to helically form the coil electrode, whereby the coil module is manufactured.

Thus, the coil component is provided with the component-side coil electrode forming a part of the coil electrode, and is not provided with the entire coil electrode. Therefore, as compared to the conventional coil component having a finished coil, the manufacturing process can be simplified and the cost of the coil component can be reduced. Unlike the conventional configuration, the wiring substrate is provided with the substrate-side coil electrode forming the remaining part of the coil electrode. However, in the process of forming the wiring substrate using a substrate forming technique commonly used, the substrate-side coil electrode can be formed together with the other wiring electrodes. Since this eliminates the need for a special process for forming the substrate-side coil electrode, an increase in the cost of manufacturing the wiring substrate can be reduced.

In a conventional configuration, wiring electrode traces are formed on both the principal surfaces of the insulating layer having the coil core embedded therein by a common wiring electrode trace forming technique, such as screen printing, plating, photolithography, or etching of metal foil (film) using resist film processing. As compared to this, the substrate-side coil electrode can be very inexpensively formed on the wiring substrate using a substrate forming technique commonly used. Therefore, by placing the coil component on the wiring substrate, the component-side coil electrode and the substrate-side coil electrode are connected to form the coil electrode, whereby the coil module including the coil component can be inexpensively manufactured.

The wiring substrate may include a first multilayer insulating layer, the coil component may be mounted on a first principal surface of the first multilayer insulating layer, and the component-side coil electrode may be connected to the substrate-side coil electrode formed in the first multilayer insulating layer.

With this configuration, the substrate-side coil electrode can be formed by using the multilayer structure of the first multilayer insulating layer of the wiring substrate, on which the coil component is mounted on the first principal surface of the first multilayer insulating layer. This can increase flexibility in the design of the substrate-side coil electrode. Also, for example, by forming the substrate-side coil electrode on an internal layer of the first multilayer insulating layer, the distance between the coil core and the substrate-side coil electrode can be widened as compared to the case of the conventional configuration in which the wiring electrode traces forming the coil electrode are formed on the principal surfaces of the insulating layer having the coil core embedded therein. This can reduce stress from the coil electrode to the coil core, and thus can improve the coil characteristics. Also, since the substrate-side coil electrode can be formed on an internal layer of the first multilayer insulating layer, a lower profile than that in the conventional configuration can be achieved.

The component-side coil electrode may include a plurality of first columnar conductors embedded in the insulating layer, disposed to intersect a direction of a winding axis of the coil electrode, arranged on a first side of the coil core, exposed at first ends thereof to a first principal surface of the insulating layer opposite the first multilayer insulating layer, and exposed at second ends thereof to a second principal surface of the insulating layer; a plurality of second columnar conductors embedded in the insulating layer, disposed to intersect the direction of the winding axis of the coil electrode, arranged on a second side of the coil core to face the plurality of first columnar conductors with the coil core interposed therebetween, exposed at first ends thereof to the first principal surface of the insulating layer, and exposed at second ends thereof to the second principal surface of the insulating layer; and a plurality of first connecting members formed on the first principal surface of the insulating layer, and each configured to connect the first ends of the first and second columnar conductors in a pair. The substrate-side coil electrode may include a plurality of second connecting members each configured to connect the second end of the corresponding first columnar conductor and the second end of the second columnar conductor adjacent on one side to the second columnar conductor paired with the corresponding first columnar conductor.

In this configuration, the plurality of first columnar conductors are disposed to intersect the direction of the central axis of the coil (i.e., the direction of a magnetic flux generated inside the coil core), that is, the direction of the winding axis of the coil electrode, arranged on the first side of the coil core, and embedded in the insulating layer. Also, the plurality of second columnar conductors are disposed to intersect the direction of the central axis of the coil, that is, the direction of the winding axis of the coil electrode, arranged on the second side of the coil core to face the plurality of first columnar conductors with the coil core interposed therebetween, and embedded in the insulating layer. The first and second columnar conductors are exposed at the first ends thereof to the first principal surface of the insulating layer opposite the first multilayer insulating layer having the substrate-side coil electrode formed therein, and exposed at the second ends thereof to the second principal surface of the insulating layer.

Then, the first ends of each pair of the first and second columnar conductors are connected to each other by the corresponding one of the plurality of first connecting members on the first principal surface of the insulating layer to form the component-side coil electrode. Thus, the coil module with a practical configuration can be provided, in which the second end of each first columnar conductor and the second end of the second columnar conductor adjacent on one side to the second columnar conductor paired with the first columnar conductor are connected by the corresponding one of the plurality of second connecting members of the substrate-side coil electrode formed in the first multilayer insulating layer to form the coil electrode.

The wiring substrate may be stacked on a first principal surface of the insulating layer opposite the first multilayer insulating layer, and may further include a second multilayer insulating layer together with the first multilayer insulating layer, the second multilayer insulating layer having the substrate-side coil electrode formed therein. The component-side coil electrode may include a plurality of first columnar conductors embedded in the insulating layer, disposed to intersect a direction of a winding axis of the coil electrode, arranged on a first side of the coil core, exposed at first ends thereof to the first principal surface of the insulating layer, and exposed at second ends thereof to a second principal surface of the insulating layer; and a plurality of second columnar conductors embedded in the insulating layer, disposed to intersect the direction of the winding axis of the coil electrode, arranged on a second side of the coil core to face the plurality of first columnar conductors with the coil core interposed therebetween, exposed at first ends thereof to the first principal surface of the insulating layer, and exposed at second ends thereof to the second principal surface of the insulating layer. The substrate-side coil electrode may include a plurality of first connecting members formed in the second multilayer insulating layer, and each configured to connect the first ends of the first and second columnar conductors in a pair; and a plurality of second connecting members formed in the first multilayer insulating layer, and each configured to connect the second end of the corresponding first columnar conductor and the second end of the second columnar conductor adjacent on one side to the second columnar conductor paired with the corresponding first columnar conductor.

In this configuration, the plurality of first columnar conductors are disposed to intersect the direction of the central axis of the coil, that is, the direction of the winding axis of the coil electrode, arranged on the first side of the coil core, and embedded in the insulating layer. Also, the plurality of second columnar conductors are disposed to intersect the direction of the central axis of the coil, that is, the direction of the winding axis of the coil electrode, arranged on the second side of the coil core to face the plurality of first columnar conductors with the coil core interposed therebetween, and embedded in the insulating layer. The first and second columnar conductors are exposed at the first ends thereof to the first principal surface of the insulating layer opposite the first multilayer insulating layer having the substrate-side coil electrode formed therein, and exposed at the second ends thereof to the second principal surface of the insulating layer, whereby the component-side coil electrode is formed.

The second multilayer insulating layer having a substrate-side coil electrode formed therein, as in the first multilayer insulating layer, is stacked on the first principal surface of the insulating layer opposite the first multilayer insulating layer. The first ends of each pair of the first and second columnar conductors are connected to each other by the corresponding one of the plurality of first connecting members of the substrate-side coil electrode formed in the second multilayer insulating layer. At the same time, the second end of each first columnar conductor and the second end of the second columnar conductor adjacent on one side to the second columnar conductor paired with the first columnar conductor are connected by the corresponding one of the plurality of second connecting members of the substrate-side coil electrode formed in the first multilayer insulating layer. Thus, the coil electrode is formed.

Therefore, the substrate-side coil electrode can be formed by using the multilayer structure of not only the first multilayer insulating layer on the second principal surface of the insulating layer of the coil component, but also of the second multilayer insulating layer stacked on the first principal surface of the insulating layer of the coil component. This can further increase flexibility in the design of the substrate-side coil electrode. Also, for example, by forming the substrate-side coil electrode on an internal layer of each of the first and second multilayer insulating layers, the distance between the coil core and the substrate-side coil electrode can be further widened as compared to the case of the conventional configuration in which the wiring electrode traces forming the coil electrode are formed on both the principal surfaces of the insulating layer having the coil core embedded therein, and undesired contact can be prevented. If the coil core has conductivity, reliable insulation can be achieved. It is possible to further reduce stress from the coil electrode to the coil core, and thus further improve the coil characteristics.

The component-side coil electrode may include a plurality of first columnar conductors embedded in the insulating layer, disposed to intersect a direction of a winding axis of the coil electrode, and arranged on a first side of the coil core; a plurality of second columnar conductors embedded in the insulating layer, disposed to intersect the direction of the winding axis of the coil electrode, and arranged on a second side of the coil core to face the plurality of first columnar conductors with the coil core interposed therebetween; and a plurality of first connecting members each integrally formed with, and of the same metal material as, the corresponding pair of the first and second columnar conductors to connect first ends of the corresponding pair of the first and second columnar conductors in the insulating layer, the first ends being opposite the first multilayer insulating layer. The first and second columnar conductors may be exposed at second ends thereof to a principal surface of the insulating layer facing the first multilayer insulating layer. The substrate-side coil electrode may include a plurality of second connecting members each configured to connect the second end of the corresponding first columnar conductor and the second end of the second columnar conductor adjacent on one side to the second columnar conductor paired with the corresponding first columnar conductor.

In this configuration, the plurality of first columnar conductors are disposed to intersect the direction of the central axis of the coil, that is, the direction of the winding axis of the coil electrode, arranged on the first side of the coil core, and embedded in the insulating layer. Also, the plurality of second columnar conductors are disposed to intersect the direction of the central axis of the coil, that is, the direction of the winding axis of the coil electrode, arranged on the second side of the coil core to face the plurality of first columnar conductors with the coil core interposed therebetween, and embedded in the insulating layer. Additionally, on the opposite side of the first multilayer insulating layer having the substrate-side coil electrode formed therein, the first ends of each pair of the first and second columnar conductors are connected to each other by the corresponding one of the plurality of first connecting members in the insulating layer. Also, each pair of the first and second columnar conductors is integrally formed with, and of the same metal material as, the first connecting member connecting the first ends of the pair to form the component-side coil electrode.

Additionally, the first and second columnar conductors are exposed at the second ends thereof to the principal surface of the insulating layer facing the first multilayer insulating layer having the substrate-side coil electrode formed therein. Then, the second end of each first columnar conductor and the second end of the second columnar conductor adjacent on one side to the second columnar conductor paired with the first columnar conductor are connected by the corresponding one of the plurality of second connecting members of the substrate-side coil electrode formed in the first multilayer insulating layer, whereby the coil electrode is formed. Thus, the component-side coil electrode can be formed by simply placing it such that each pair of the first and second columnar conductors and the corresponding first connecting member integrally formed of the same metal material are astride the coil core. Therefore, it is possible to simplify the manufacturing process and further reduce the cost of the coil component. Also, in manufacturing the coil component, there is no need to take into account misalignment between each pair of the first and second columnar conductors and the corresponding first connecting member. Therefore, it is possible to further narrow the pitch of the component-side coil electrode.

The coil electrode may include a plurality of electrode groups helically wound with different coil diameters around the coil core, and the electrode group with a small coil diameter may be disposed inside the electrode group with a large coil diameter to form the coil electrode in a multi-winding structure.

Forming the coil electrode in a multi-winding structure as described above can increase the number of turns in the coil, and thus can further improve the coil characteristics.

For example, if the first and second multilayer insulating layers, each having the substrate-side coil electrode formed therein, are stacked on the respective principal surfaces of the insulating layer having the coil core embedded therein, the positions of the first and second connecting members forming each of the electrode groups having different coil diameters may be made different for each electrode group in the stacking direction of the first and second multilayer insulating layers. With this configuration, wiring on the upper and lower sides of the coil core can be formed reliably on different layers. This can reduce the possibility of contact between wires of the coil, and can make it easier to realize multiple winding of the coil.

Also, for example, if the first and second columnar conductors and the corresponding first connecting member integrally formed of the same metal material are embedded in the insulating layer of the coil component to form the component-side coil electrode, the length of the first and second columnar conductors forming each of the electrode groups having different coil diameters may be made different for each electrode group, and the position of the second connecting members forming each of the electrode groups having different coil diameters may be made different for each electrode group in the stacking direction of the second multilayer insulating layer.

The coil electrode may be formed by a first electrode group having a predetermined coil diameter and a second electrode group having a smaller coil diameter than the first electrode group. The first connecting members of the first electrode group and the first connecting members of the second electrode group may be alternately arranged in plan view. Wiring lengths of respective turns in the first electrode group may be substantially the same, and the first and second columnar conductors of the first electrode group may be individually arranged in a staggered manner.

In this configuration, the wiring lengths of respective turns in the first electrode group having a large coil diameter are substantially the same, and the first and second columnar conductors of the first electrode group are individually arranged in a staggered manner. Since this can prevent contact between the first connecting members of the first and second electrode groups alternately arranged in plan view, it is possible to further narrow the pitch of the coil electrode. Since narrowing the pitch of the coil electrode can further increase the number of turns in the coil, it is possible to further improve the coil characteristics.

The coil may have the coil core with a toroidal shape. The first columnar conductors may be arranged on an outer side, which is the first side of the core, along an outer periphery of the coil core, and the second columnar conductors may be arranged on an inner side, which is the second side of the core, along an inner periphery of the coil core.

In this configuration, the coil has the coil core with a toroidal shape, the first columnar conductors are arranged on the outer side (first side) of the coil core along the outer periphery of the coil core, and the second columnar conductors are arranged on the inner side (second side) of the coil core along the inner periphery of the coil core. Since this provides a closed magnetic path structure in which a magnetic flux generated by the coil mainly passes through the coil core having an annular toroidal shape, the coil module with less leakage flux can be realized.

The first and second columnar conductors may each be formed by a metal pin.

In this configuration, the first and second columnar conductors that form wiring of the coil electrode in the direction (which may hereinafter be referred to as "columnar conductor direction") intersecting the direction of the central axis of the coil, that is, the direction of the winding axis of the coil electrode, are each formed by a metal pin. Therefore, by simply increasing the length of each metal pin, the wiring length of the coil electrode in the columnar conductor direction can be easily increased. It is thus possible to easily increase the thickness of the coil core in the columnar conductor direction.

Since the first and second columnar conductors are each formed by a metal pin, the wiring of the coil electrode in the columnar conductor direction can be formed by simply arranging the metal pins, and there is no need to form a plurality of through holes, as in the case of forming through-hole conductors or via conductors, in a printed circuit board or a core substrate, such as a prepreg substrate, to form the wiring of the coil electrode in the columnar conductor direction. Also, unlike in the case of through-hole conductors or via conductors, the thickness of wires in the coil electrode formed by the metal pins can be kept unchanged in the columnar conductor direction. Therefore, it is possible to provide a coil module that includes a coil having a thick coil core and excellent impedance characteristics, and is capable of narrowing the pitch of the coil electrode.

The substrate-side coil electrode may be formed by connected-via conductors each formed by arranging a plurality of via conductors in a planar direction of the wiring substrate such that the plurality of via conductors partly overlap each other.

Thus, as compared to typical wiring electrode traces formed by screen printing or etching of metal foil (film), the resistance of the substrate-side coil electrode can be further reduced.

The coil module may further include other components mounted on the wiring substrate.

By mounting chip components, such as a chip inductor, a chip capacitor, and a chip resistor, and functional components, such as a high-frequency filter, a high-frequency switch, and an RF-IC, on the wiring substrate as other components, the coil module having a practical configuration and various functions can be provided.

The coil module may further include a plurality of third columnar conductors embedded in the insulating layer, exposed at first ends thereof from the insulating layer as external connection terminals, and connected at second ends thereof to the wiring substrate.

In this configuration, the plurality of third columnar conductors for external connection of the wiring substrate is embedded in the insulating layer of the coil component. Therefore, the component-side coil electrode of the coil component and the plurality of third columnar conductors for external connection of the coil module can be formed simultaneously in the process of forming the coil component, without significantly increasing the cost of manufacture. Thus, by simply placing, on the wiring substrate, the coil component having the plurality of third columnar conductors for external connection, the coil module can be easily connected to an external device by the first ends of the third columnar conductors, each serving as an external connection terminal. Since the process of forming connection terminals for external connection can thus be simplified, the cost of manufacturing the coil module can be reduced.

According to the present disclosure, the coil component is provided with the component-side coil electrode forming a part of the helical portion of the coil electrode, and is not provided with the entire coil electrode. Therefore, as compared to the conventional coil component having a finished coil, the manufacturing process can be simplified and the cost of the coil component can be reduced. The wiring substrate is provided with the substrate-side coil electrode forming the remaining part of the helical portion of the coil electrode. In the process of forming the wiring substrate using a substrate forming technique commonly used, the substrate-side coil electrode can be easily formed together with other wiring electrodes. By placing the coil component on the wiring substrate, the component-side coil electrode and the substrate-side coil electrode can be connected to helically form the coil electrode. Thus, the coil module having the coil component can be inexpensively manufactured.

DESCRIPTION OF EMBODIMENTS

<First Embodiment>

A coil module according to a first embodiment of the present disclosure will be described.

(Schematic Configuration of Coil Module)

Figure 1:
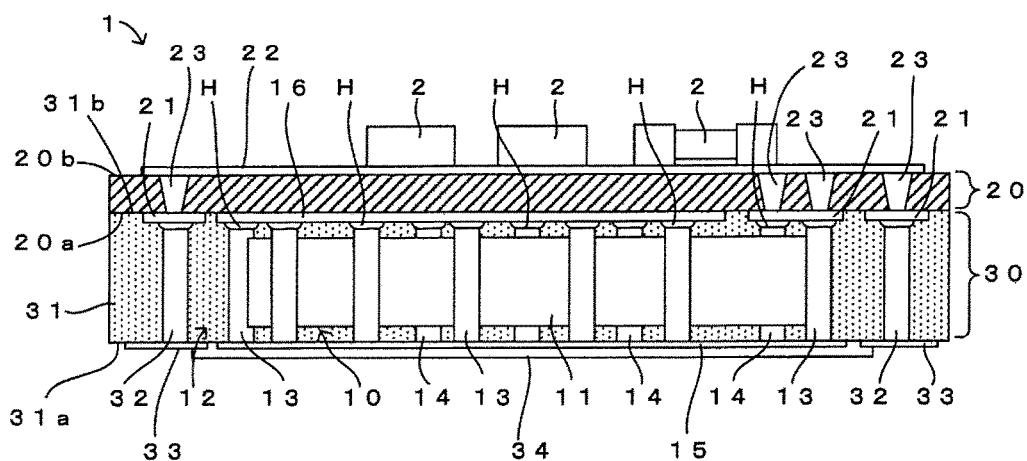
FIG. 1 is a partial cross-sectional view of a coil module according to a first embodiment of the present disclosure.
Figure 2:
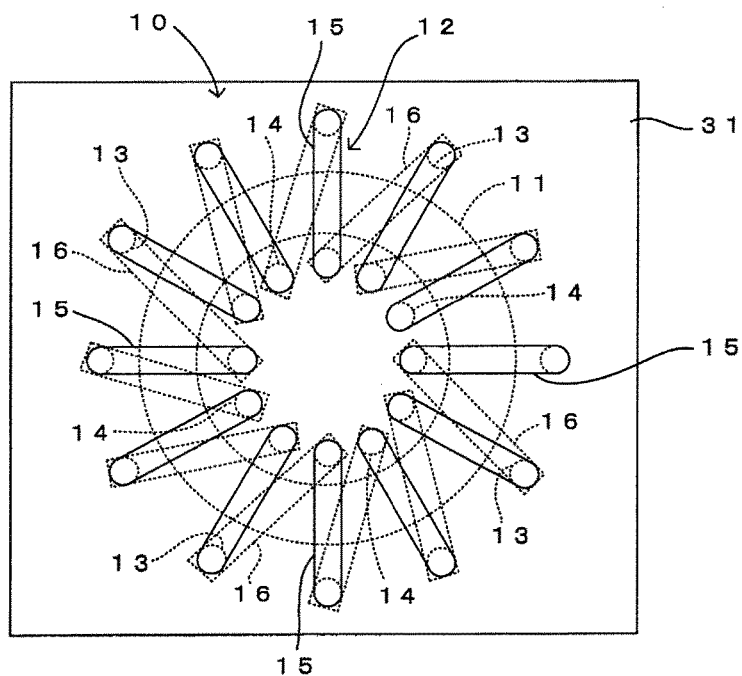
FIG. 2 is a diagram for explaining how columnar conductors forming a coil electrode are connected.

A schematic configuration of a coil module 1 will be described with reference to FIGS. 1 and 2. FIG. 1 is a partial cross-sectional view of a coil module according to the first embodiment of the present disclosure. FIG. 2 is a diagram for explaining how columnar conductors forming a coil electrode of a coil included in the coil module of FIG. 1 are connected. FIG. 2 illustrates the coil module of FIG. 1 as viewed from the lower side of the drawing. For ease of explanation, the drawings (including FIGS. 1 and 2) to be referred to in the following description schematically illustrate the configuration of electrodes, or omit some of columnar conductors, and their detailed description will be omitted in the following description.

As illustrated in FIGS. 1 and 2, the coil module 1 is a module that includes a coil 10 having a coil core 11 and a coil electrode 12 helically wound around the coil core 11. The coil module 1 includes a wiring substrate 20, a coil component 30 disposed and mounted at a predetermined position on a first principal surface 20a of the wiring substrate 20, and circuit components 2 mounted on a second principal surface 20b of the wiring substrate 20. As necessary, chip components, such as a chip inductor, a chip capacitor, and a chip resistor, and functional components, such as a high-frequency filter, a high-frequency switch, and an RF-IC, are mounted on the second principal surface 20b of the wiring substrate 20 as "other components" of the present disclosure to form the coil module 1 having various functions. In the present embodiment, the coil 10 has the coil core 11 with an annular toroidal shape.

The wiring substrate 20 is provided with a plurality of land electrodes 21 and a plurality of linear substrate-side wiring electrode traces 16 formed on the first principal surface 20a, and also provided with a plurality of land electrodes 22 formed on the second principal surface 20b. The land electrodes 21 are for external connection, the substrate-side wiring electrode traces 16 form a part of the helical portion of the coil electrode 12, and the land electrodes 22 are for mounting the circuit components 2 thereon. The land electrodes 21 on the first principal surface 20a and the land electrodes 22 on the second principal surface 20b are connected to each other by internal wiring electrodes 23, such as interlayer connection conductors (via conductors) or in-plane conductors, formed inside the wiring substrate 20. The wiring substrate 20 can be formed by a resin multilayer substrate using resin or polymer material, a printed circuit board, an LTCC substrate, an alumina substrate, a glass substrate, a composite material substrate, a single-layer substrate, or a multilayer substrate. The wiring substrate 20 may be formed by appropriately selecting the most suitable material in accordance with the intended use of the coil module 1.

As described above, the land electrodes 21 and 22 and the internal wiring electrodes 23 are configured as "other wiring electrodes" of the present disclosure.

The coil component 30 includes a resin insulating layer 31 (corresponding to "insulating layer" in the present disclosure) formed by a single layer and having the coil core 11 embedded therein. The resin insulating layer 31 is provided with a plurality of first columnar conductors 13 each formed by a metal pin, a plurality of second columnar conductors 14 each formed by a metal pin, and a plurality of linear component-side wiring electrode traces 15. The first columnar conductors 13, the second columnar conductors 14, and the component-side wiring electrode traces 15 form a part of the helical portion of the coil electrode 12. The resin insulating layer 31 has third columnar conductors 32 embedded therein. The third columnar conductors 32 are for external connection and each formed by a metal pin. A first principal surface 31a of the resin insulating layer 31 is provided with mounting electrodes 33 for external connection and a resin protective layer 34.

The resin insulating layer 31 is formed of a resin, such as thermosetting epoxy resin, commonly used for resin sealing (molding). The coil core 11 is formed of a magnetic material, such as ferrite or iron, commonly used to form a coil core. The resin insulating layer 31 may be formed by multiple layers of the same resin or different resins.

The first columnar conductors 13 are each embedded in the resin insulating layer 31, disposed substantially orthogonal to the direction of the central axis of the coil 10, that is, the direction of the winding axis of the coil electrode 12, and arranged on an outer side (first side) of the coil core 11 along the outer periphery of the coil core 11. Note that the direction of the winding axis of the coil electrode in the present disclosure is the direction of a magnetic flux (magnetic field) generated inside the annular coil core 11. In the first embodiment where the annular coil core 11 is used, the magnetic flux is generated in the circumferential direction of the coil core 11. The first columnar conductors 13 are exposed at first ends thereof to the first principal surface 31a of the resin insulating layer 31 opposite the wiring substrate 20, and exposed at second ends thereof to a second principal surface 31b of the resin insulating layer 31.

The second columnar conductors 14 are each embedded in the resin insulating layer 31, disposed substantially orthogonal to the direction of the central axis of the coil 10, that is, the direction of the winding axis of the coil electrode 12, and arranged on an inner side (second side) of the coil core 11 along the inner periphery of the coil core 11. The second columnar conductors 14 are exposed at first ends thereof to the first principal surface 31a of the resin insulating layer 31, and exposed at second ends thereof to the second principal surface 31b of the resin insulating layer 31. The first columnar conductors 13 and/or the second columnar conductors 14 may be disposed in any manner as long as they are disposed to intersect the direction of the central axis of the coil 10, that is, the direction of the winding axis of the coil electrode 12. For example, the first columnar conductors 13 and/or the second columnar conductors 14 may be disposed to be inclined with respect to a direction orthogonal to the direction of the central axis of the coil 10, that is, the direction of the winding axis of the coil electrode 12.

The component-side wiring electrode traces 15 are each formed on the first principal surface 31a of the resin insulating layer 31, and connected to the corresponding first ends of the respective columnar conductors 13 and 14 exposed to the first principal surface 31a of the resin insulating layer 31. The first ends of the first and second columnar conductors 13 and 14 in a pair are connected to each other by the corresponding one of the component-side wiring electrode traces 15.

The respective second ends of the first and second columnar conductors 13 and 14 each exposed to the second principal surface 31b of the resin insulating layer 31 are connected to the corresponding one of the substrate-side wiring electrode traces 16 using a bonding material H, such as solder, in the following manner. That is, the second end of each first columnar conductor 13 and the second end of the second columnar conductor 14 adjacent on one side (in the counterclockwise direction in FIG. 2 in the present embodiment) to the second columnar conductor 14 paired with the first columnar conductor 13 are connected to each other by the corresponding substrate-side wiring electrode trace 16. Thus, the columnar conductors 13 and 14 and the component-side wiring electrode traces 15 provided in the coil component 30 are connected to the substrate-side wiring electrode traces 16 on the first principal surface 20a of the wiring substrate 20 to helically form the coil electrode 12, whereby the coil electrode 12 helically wound around the coil core 11 is formed. That is, the coil electrode 12 is helically formed by connecting the columnar conductors 13 and 14 and the component-side wiring electrode traces 15 having a non-helical shape to the substrate-side wiring electrode traces 16 having a non-helical shape.

As illustrated in FIGS. 1 and 2, the second ends of some columnar conductors 13 and 14 to which the substrate-side wiring electrode traces 16 are not connected are connected to the land electrodes 21 on the first principal surface 20a of the wiring substrate 20 using the bonding material H, such as solder, and further connected to the land electrodes 22 on the second principal surface 20b of the wiring substrate 20, with the internal wiring electrodes 23 interposed therebetween, and used as terminals for signal extraction. As described above, in the present embodiment, the columnar conductors 13 and 14 and the component-side wiring electrode traces 15 are configured as a "component-side coil electrode" of the present disclosure, and the component-side wiring electrode traces 15 are configured as "first connecting members" of the present disclosure. The substrate-side wiring electrode traces 16 are configured as a "substrate-side coil electrode" and "second connecting members" of the present disclosure.

The first ends of the third columnar conductors 32 are each exposed from the first principal surface 31a of the resin insulating layer 31 as an external connection terminal and connected to the corresponding mounting electrode 33, and the second ends of the third columnar conductors 32 are each exposed to the second principal surface 31b of the resin insulating layer 31 and connected to the corresponding land electrode 21 on the first principal surface 20a of the wiring substrate 20 using the bonding material H, such as solder. Thus, the wiring substrate 20 (the circuit components 2, the coil 10) is connected to an external device, with the third columnar conductors 32 and the mounting electrodes 33 interposed therebetween.

The columnar conductors 13, 14, and 32 are each formed of a metal material, such as Cu, Au, Ag, Al, or an alloy of these materials, commonly used to form a wiring electrode. The columnar conductors 13, 14, and 32 may each be formed by a pin-like member plated with Cu or Ni. The cross-section of each of the columnar conductors 13, 14, and 32 in the length direction may be either rectangular or trapezoidal.

The wiring electrode traces 15 and 16 are formed by photolithography or etching of metal foil (film) using a resist film, or by printing a conductive paste containing Cu, Au, or Ag using screen printing. The traces formed by screen printing may be plated. The method for connecting the corresponding first ends of the columnar conductors 13 and 14 is not limited to the example described above. For example, the corresponding first ends of the columnar conductors 13 and 14 may be connected by a wire bonding process using a bonding wire as a first connecting member.

The first columnar conductors 13 arranged on the outer side the coil core 11 may be formed to have a greater diameter than the second columnar conductors 14 arranged on the inner side of the coil core 11. When the number of turns in the coil 10 needs to be increased for higher inductance, since the space for arranging the columnar conductors 14 on the inner side of the annular coil core 11 is limited, the diameter of the columnar conductors 14 is reduced to reduce their cross-sectional area, so that the number of turns in the coil 10 can be increased. Reducing the diameter may increase the resistance value of the columnar conductors 14 and degrade the coil characteristics. However, if the columnar conductors 13 arranged on the outer side of the coil core 11, where there is enough space for arrangement, have a greater diameter than the columnar conductors 14, it is possible to reduce an increase in the resistance value of the entire coil electrode 12.

When the diameter of the first columnar conductors 13 is made different from that of the second columnar conductors 14, the wiring electrode traces 15 and 16 may be formed to match the impedance between the first and second columnar conductors 13 and 14 having different diameters. For example, the wiring electrode traces 15 and 16 may be tapered from the first columnar conductors 13 with a large diameter toward the second columnar conductors 14 with a small diameter to match the impedance between the columnar conductors 13 and 14.

(Method for Manufacturing Coil Module)

Figure 3A:
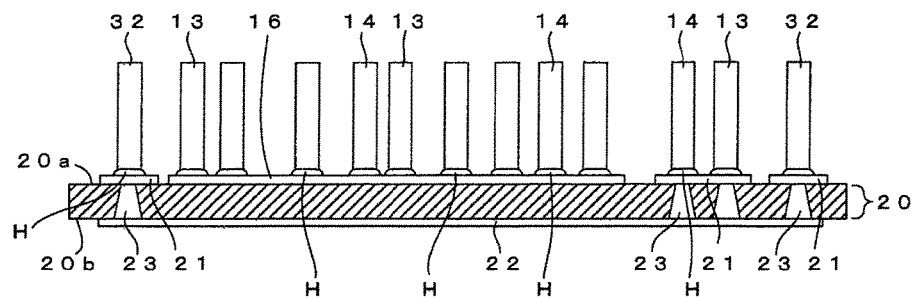
FIGS. 3A-3D are partial cross-sectional views illustrating a method for manufacturing the coil module illustrated in FIG. 1; 3A illustrates a state where columnar conductors are mounted on a wiring substrate, 3B illustrates a state where a coil core is placed, 3C illustrates a state where a resin insulating layer of a coil component is formed, and 3D illustrates a state where the coil component is completed.
Figure 3B:
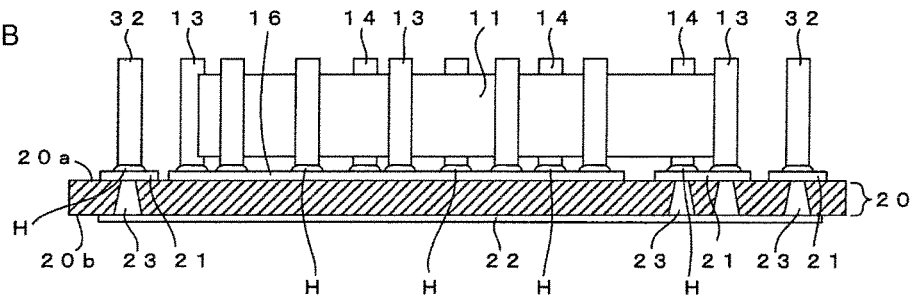
Figure 3C:
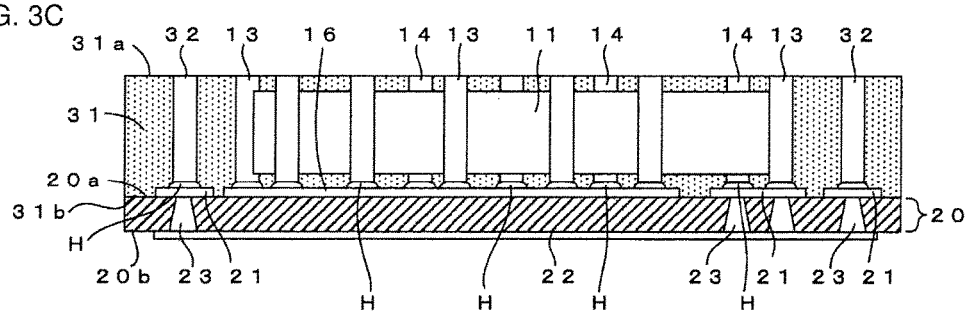
Figure 3D:
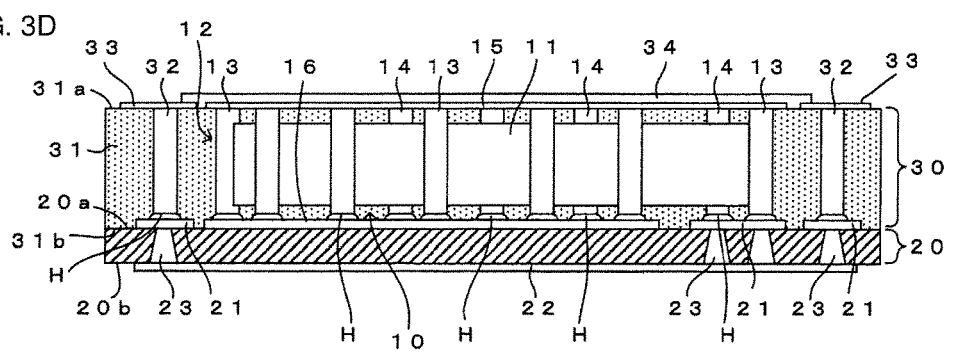

With reference to FIGS. 3A-3D, a method for manufacturing the coil module 1 will be described. FIGS. 3A-3D are partial cross-sectional views illustrating a method for manufacturing the coil module illustrated in FIG. 1. FIG. 3A illustrates a state where columnar conductors are mounted on a wiring substrate, FIG. 3B illustrates a state where a coil core is placed, FIG. 3C illustrates a state where a resin insulating layer of a coil component is formed, and FIG. 3D illustrates a state where the coil component is completed.

First, as illustrated in FIG. 3A, the wiring substrate 20 is prepared, which is provided with the land electrodes 21 and 22 and the substrate-side wiring electrode traces 16 at predetermined positions on the principal surfaces 20a and 20b and also provided with the internal wiring electrodes 23. Next, the second ends of the first and second columnar conductors 13 and 14 are connected at predetermined positions on the substrate-side wiring electrode traces 16 on the first principal surface 20a of the wiring substrate 20 using the bonding material H, such as solder. The second ends of the third columnar conductors 32 are connected to the respective land electrodes 21 on the first principal surface of the wiring substrate 20 using the bonding material H, such as solder. Thus, the first and second columnar conductors 13 and 14 forming a part of the coil electrode 12 and the third columnar conductors 32 for external connection can be placed together on the first principal surface 20a of the wiring substrate 20 at the same time.

To prevent contact between the coil core 11 and the substrate-side wiring electrode traces 16, a solder resist layer may be formed in the area other than the portions where the second ends of the columnar conductors 13 and 14 are connected and the land electrodes 21 are placed, and in the area where the coil core 11 is placed.

By connecting the columnar conductors 13 and 14 to the corresponding substrate-side wiring electrode traces 16, the second end of each first columnar conductor 13 and the second end of the second columnar conductor 14 adjacent on one side to the second columnar conductor 14 paired with the first columnar conductor 13 are connected by the corresponding one of the substrate-side wiring electrode traces 16. The second ends of the columnar conductors 13 and 14 for signal extraction, which are not connected to the substrate-side wiring electrode traces 16, are connected to the corresponding land electrodes 21.

Next, as illustrated in FIG. 3B, the coil core 11 is placed in an annular region over the first principal surface 20a of the wiring substrate 20, between the first columnar conductors 13 on the outside and the second columnar conductors 14 on the inside. Thus, the first columnar conductors 13 are disposed substantially orthogonal to the direction of the central axis of the coil 10, that is, the direction of the winding axis of the coil electrode 12, and arranged on the outer side of the coil core 11 along the outer periphery of the coil core 11, whereas the second columnar conductors 14 are disposed substantially orthogonal to the direction of the central axis of the coil 10 and arranged on the inner side of the coil core 11 along the inner periphery of the coil core 11. The first columnar conductors 13 and the second columnar conductors 14 are thus disposed to face each other, with the coil core 11 interposed therebetween.

Next, as illustrated in FIG. 3C, the coil core 11 and the columnar conductors 13, 14, and 32 are resin-sealed with a typical thermosetting mold resin to form the resin insulating layer 31. Next, as illustrated in FIG. 3C, the resin on the first principal surface 31a of the resin insulating layer 31 is removed by polishing or grinding such that the columnar conductors 13, 14, and 32 are exposed at the first ends thereof.

Next, as illustrated in FIG. 3D, the plurality of component-side wiring electrode traces 15 are formed to connect the corresponding first ends of the first and second columnar conductors 13 and 14 exposed to the first principal surface 31a of the resin insulating layer 31. Also, the mounting electrodes 33 for external connection are formed to be connected to the respective first ends of the third columnar conductors 32 exposed to the first principal surface 31a of the resin insulating layer 31. Additionally, the resin protective layer 34 that protects the component-side wiring electrode traces 15 and the mounting electrodes 33 is formed over the first principal surface 31a of the resin insulating layer 31. Then, as illustrated in FIG. 1, the predetermined circuit components 2 are mounted on the second principal surface 20b of the wiring substrate 20 to complete the coil module 1.

The process of removing the resin on the first principal surface 31a of the resin insulating layer 31 may be carried out such that the first ends of the columnar conductors 13, 14, and 32 are exposed to slightly protrude from the first principal surface 31a of the resin insulating layer 31. Also, for example, the first ends of the columnar conductors 13, 14, and 32 can be exposed to protrude from the resin insulating layer 31 by polishing the first principal surface 31a of the resin insulating layer 31 with an abrasive which is softer than the columnar conductors 13, 14, and 32 and harder than the resin insulating layer 31.

As described above, in the present embodiment, the component-side coil electrode (the first and second columnar conductors 13 and 14, the component-side wiring electrode traces 15) forming a part of the helical portion of the coil electrode 12 helically wound around the coil core 11 to form the coil 10 is provided in the resin insulating layer 31 formed by a single layer and having the coil core 11 of the coil component 30 embedded therein. At the same time, the substrate-side coil electrode (the substrate-side wiring electrode traces 16) forming the remaining part of the helical portion of the coil electrode 12 and the other wiring electrodes (the land electrodes 21 and 22, the internal wiring electrodes 23) are provided in the wiring substrate 20. Then, the coil component 30 is placed on the wiring substrate 20, the component-side coil electrode of the coil component is connected to the substrate-side wiring electrode traces 16 on the wiring substrate 20, and thus the coil module 1 is manufactured.

Figure 21:
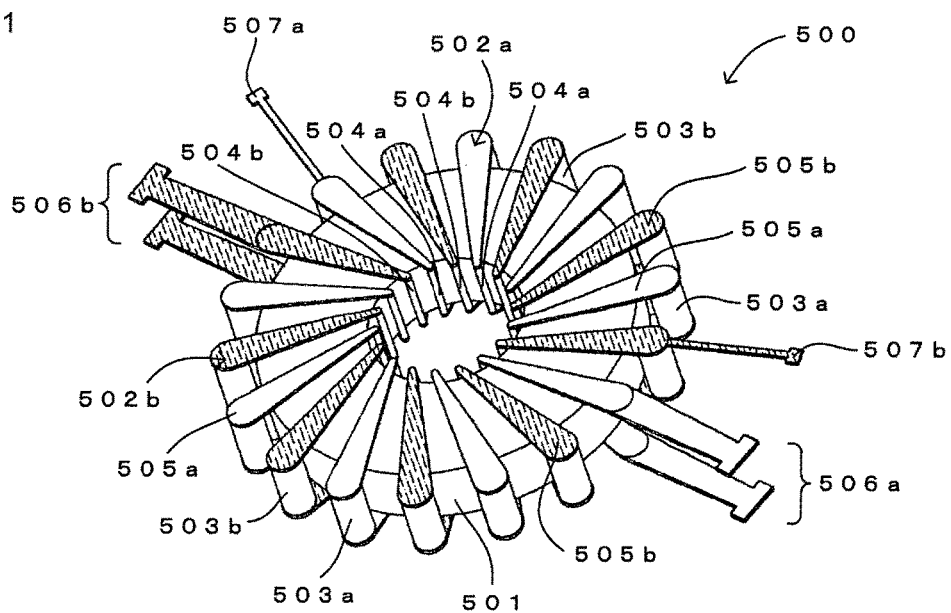
FIG. 21 illustrates a conventional coil component.

The coil component 30 is provided with the component-side coil electrode (the first and second columnar conductors 13 and 14, the component-side wiring electrode traces 15) forming a part of the coil electrode 12, and is not provided with the entire coil electrode 12. Therefore, as compared to the conventional coil component 500 (see FIG. 21) having a finished coil, the manufacturing process can be simplified and the cost of the coil component 30 can be reduced. Unlike the conventional configuration, the wiring substrate 20 is provided with the substrate-side coil electrode (the substrate-side wiring electrode traces 16) forming the remaining part of the coil electrode 12. However, in the process of forming the wiring substrate 20 using a substrate forming technique commonly used, the substrate-side coil electrode can be formed together with the other wiring electrodes (the land electrodes 21 and 22, the internal wiring electrodes 23). Since this eliminates the need for a special process for forming the substrate-side coil electrode, an increase in the cost of manufacturing the wiring substrate 20 can be reduced.

In a conventional configuration, wiring electrode traces are formed on both the principal surfaces 31a and 31b of the resin insulating layer 31 having the coil core 11 embedded therein, by a wiring electrode trace forming technique commonly used. As compared to this, the substrate-side wiring electrode traces 16 forming a part of the coil electrode 12 can be very inexpensively formed on the wiring substrate 20 using a substrate forming technique commonly used. Therefore, by placing the coil component 30 on the wiring substrate 20, the component-side coil electrode and the substrate-side coil electrode are connected to form the coil electrode 12, whereby the coil module 1 including the coil component 30 can be inexpensively manufactured.

The plurality of first columnar conductors 13 are disposed to intersect the direction of the winding axis of the coil electrode 12, arranged on the outer side (first side) of the coil core 11, and embedded in the resin insulating layer 31. Also, the plurality of second columnar conductors 14 are disposed to intersect the direction of the winding axis of the coil electrode 12, arranged on the inner side (second side) of the coil core 11 to face the plurality of first columnar conductors 13 with the coil core 11 interposed therebetween, and embedded in the resin insulating layer 31. The first columnar conductors 13 and the second columnar conductors 14 are exposed at the first ends thereof to the first principal surface 31a of the resin insulating layer 31 opposite the wiring substrate 20 having the substrate-side wiring electrode traces 16 thereon, and exposed at the second ends thereof to the second principal surface 31b of the resin insulating layer 31.

The first ends of each pair of the first and second columnar conductors 13 and 14 are connected to each other by the corresponding one of the plurality of component-side wiring electrode traces 15 on the first principal surface 31a of the resin insulating layer 31 to form the component-side coil electrode. Thus, the coil module 1 with a practical configuration can be provided, in which the second end of each first columnar conductor 13 and the second end of the second columnar conductor 14 adjacent on one side to the second columnar conductor 14 paired with the first columnar conductor 13 are connected by the corresponding one of the substrate-side wiring electrode traces 16 formed as the substrate-side coil electrode on the first principal surface 20a of the wiring substrate 20 to form the coil electrode 12.

The coil 10 has the coil core 11 with a toroidal shape, the first columnar conductors 13 are arranged on the outer side (first side) of the coil core 11 along the outer periphery of the coil core 11, and the second columnar conductors 14 are arranged on the inner side (second side) of the coil core 11 along the inner periphery of the coil core 11. Since this provides a closed magnetic path structure in which a magnetic flux generated by the coil 10 mainly passes through the coil core 11 having an annular shape, the coil module 1 with less leakage flux can be realized.

The first and second columnar conductors 13 and 14 that form wiring of the coil electrode 12 in the direction intersecting the direction of the winding axis of the coil electrode 12 are each formed by a metal pin. Therefore, by simply increasing the length of each metal pin, the wiring length of the coil electrode 12 in the columnar conductor direction can be easily increased. It is thus possible to easily increase the thickness of the coil core 11 in the columnar conductor direction.

Since the first and second columnar conductors 13 and 14 are each formed by a metal pin, the wiring of the coil electrode 12 in the columnar conductor direction can be formed by simply arranging the metal pins, and there is no need to form a plurality of through holes, as in the case of forming through-hole conductors or via conductors, in a printed circuit board or a core substrate, such as a prepreg substrate, to form the wiring of the coil electrode 12 in the columnar conductor direction. Also, unlike in the case of through-hole conductors or via conductors, the thickness of wires in the coil electrode 12 formed by the metal pins can be kept unchanged in the columnar conductor direction. Therefore, it is possible to provide the coil module 1 that includes the coil having the coil core 11 with a large thickness and having excellent impedance characteristics, and is capable of narrowing the pitch of the coil electrode 12.

By mounting chip components, such as a chip inductor, a chip capacitor, and a chip resistor, and functional components, such as a high-frequency filter, a high-frequency switch, and an RF-IC, on the second principal surface 20b of the wiring substrate 20 as the circuit components 2, the coil module 1 having a practical configuration and various functions can be provided. Also, unlike a conventional configuration, a part of the coil electrode 12 is formed on the side of the wiring substrate 20 on which the coil component 30 is disposed. It is thus possible to reduce the size of the coil component 30 and reduce the profile of the coil module 1.

The plurality of third columnar conductors 32 for external connection of the wiring substrate 20 are embedded in the resin insulating layer 31 of the coil component 30. Therefore, the component-side coil electrode of the coil component 30 and the plurality of third columnar conductors 32 for external connection of the coil module 1 can be formed simultaneously in the process of forming the coil component 30, without significantly increasing the cost of manufacture. Thus, by simply placing, on the wiring substrate 20, the coil component 30 having the plurality of third columnar conductors 32 for external connection, the coil module 1 can be easily connected to an external device by the first ends of the third columnar conductors 32, each serving as an external connection terminal. Since the process of forming connection terminals for external connection can thus be simplified, the cost of manufacturing the coil module 1 can be reduced.

<Second Embodiment>

A coil module according to a second embodiment of the present disclosure will be described with reference to FIGS. 4A to 6B.

Figure 4A:
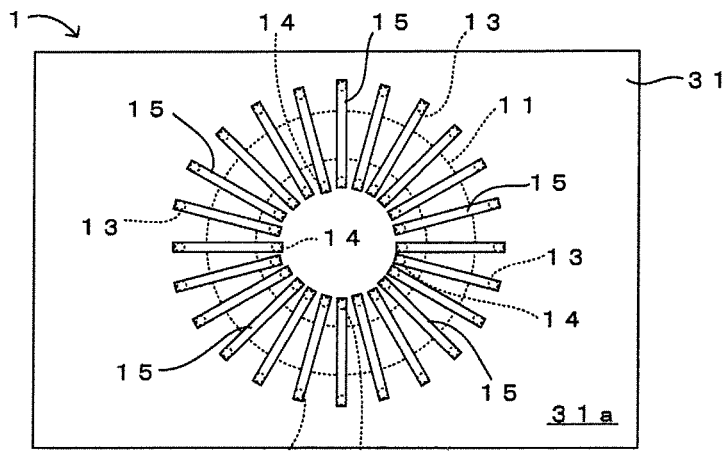
FIGS. 4A and 4B illustrate a coil module according to a second embodiment of the present disclosure; 4A is a plan view and 4B is a partial cross-sectional view.
Figure 4B:
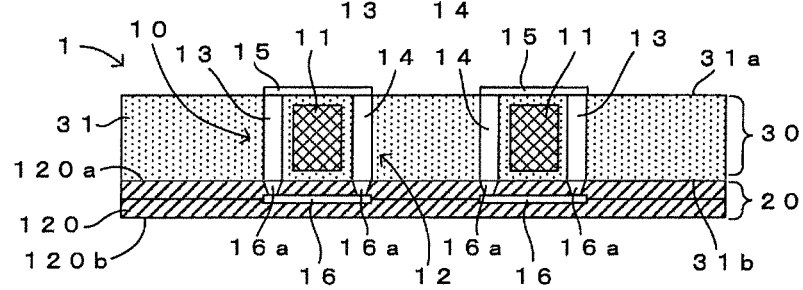
Figure 5A:
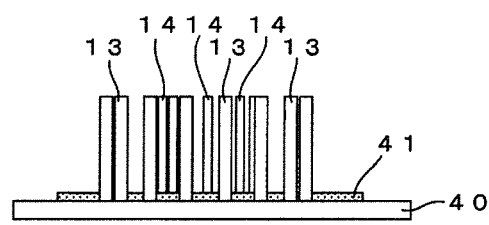
FIGS. 5A-5C are partial cross-sectional views illustrating a method for manufacturing the coil module illustrated in FIGS. 4A and 4B; 5A illustrates a state where columnar conductors are placed on a release sheet, 5B illustrates a state where the coil core is placed, and 5C illustrates a state where the resin insulating layer of the coil component is formed.
Figure 5B:
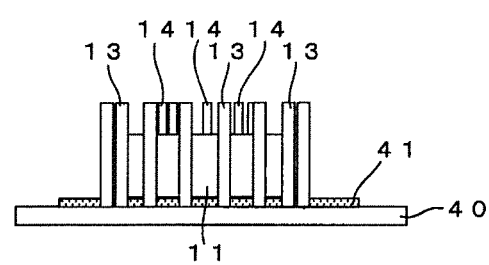
Figure 5C:
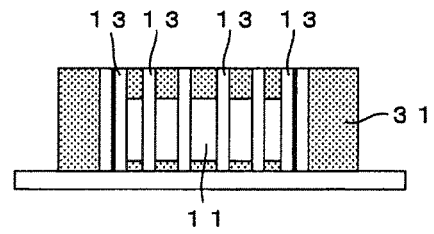
Figure 6A:
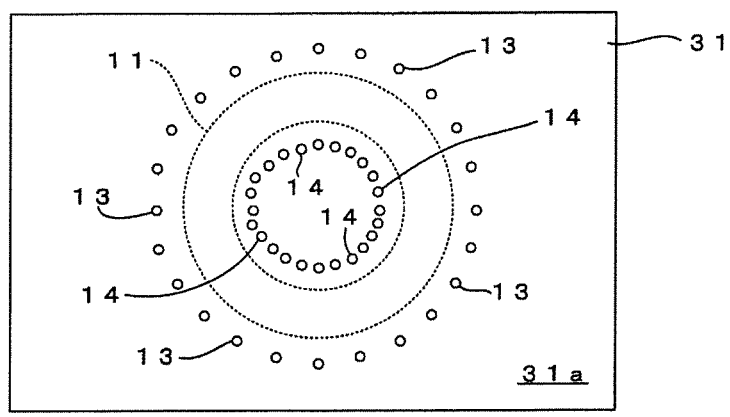
FIGS. 6A and 6B illustrate the coil component before formation of component-side wiring electrode traces; 6A is a plan view and 6B is a partial cross-sectional view.
Figure 6B:
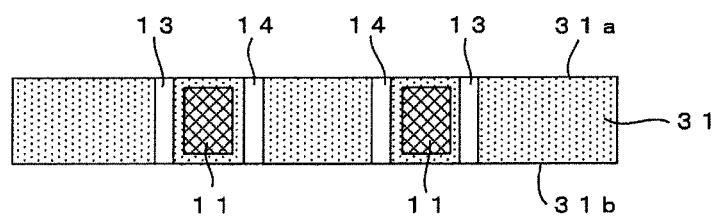

FIGS. 4A and 4B illustrates a coil module according to the second embodiment of the present disclosure. FIG. 4A is a plan view, and FIG. 4B is a partial cross-sectional view. FIGS. 5A-5C are partial cross-sectional views illustrating a method for manufacturing the coil module illustrated in FIGS. 4A and 4B. FIG. 5A illustrates a state where columnar conductors are placed on a release sheet, FIG. 5B illustrates a state where the coil core is placed, and FIG. 5C illustrates a state where the resin insulating layer of the coil component is formed. FIGS. 6A and 6B illustrate the coil component before formation of component-side wiring electrode traces. FIG. 6A is a plan view, and FIG. 6B is a partial cross-sectional view.

The coil module 1 of the present embodiment differs from that of the first embodiment in that, as illustrated in FIGS. 4A and 4B, the wiring substrate 20 includes a multilayer resin insulating layer 120 (corresponding to "first multilayer insulating layer" in the present disclosure) and the coil component 30 is mounted on a first principal surface 120a of the multilayer resin insulating layer 120. Also, the second connecting members of the substrate-side coil electrode forming a part of the coil electrode 12 are formed in the multilayer resin insulating layer 120 by the substrate-side wiring electrode traces 16 and via conductors 16a, and the component-side coil electrode (the columnar conductors 13 and 14, the component-side wiring electrode traces 15) and the substrate-side coil electrode are connected to form the coil electrode 12. The method for forming the coil component 30 also differs from that in the first embodiment. The following description mainly refers to differences from the first embodiment. The other configurations are the same as those described in the first embodiment, and their description will be omitted by using the same reference numerals.

A method for manufacturing the coil module of the present embodiment will be described with reference to FIGS. 5A-6B.

First, a plate-like transfer member is prepared, which is configured to support, on one side thereof, the first ends of the first and second columnar conductors 13 and 14 forming the component-side coil electrode. A doughnut-shaped predetermined region having substantially the same shape as the coil core 11 with an annular toroidal shape, in plan view (viewed in a direction perpendicular to the first principal surface 31a of the resin insulating layer 31), is defined on the one side of the transfer member. Then, the first columnar conductors 13 are arranged on the outer side (first side) of the predetermined region along the direction of the winding axis of the coil electrode 12 (i.e., the central axis of the coil core 11) or along the outer circumferential direction of the predetermined region, and the second columnar conductors 14 are arranged on the inner side (second side) of the predetermined region along the direction of the winding axis of the coil electrode 12 (i.e., the central axis of the coil core 11) or along the inner circumferential direction of the predetermined region. The first columnar conductors 13 and the second columnar conductors 14 are arranged to face each other with the predetermined region interposed therebetween, whereby a terminal assembly is prepared.

Next, as illustrated in FIG. 5A, a viscous support layer 41 of thermosetting resin (e.g., liquid resin) is formed on a release sheet 40. The second ends of the columnar conductors 13 and 14 are penetrated into the support layer 41, so that the terminal assembly is vertically mounted. Then, the support layer 41 is thermally cured to remove the transfer member. The release sheet 40 used may be of any type. For example, the release sheet 40 may be a sheet obtained by forming a mold release layer on a resin sheet (e.g., polyethylene terephthalate sheet, polyethylene naphthalate sheet, or polyimide sheet), or may be a resin sheet (e.g., fluororesin sheet) having a mold release function. The third columnar conductors 32 for external connection may also be supported at the same time to form the terminal assembly. In this case, the first and second columnar conductors 13 and 14 and the third columnar conductors 32 are simultaneously transferred onto the support layer 41 on the release sheet 40.

Next, as illustrated in FIG. 5B, the coil core 11 is placed between the first columnar conductors 13 and the second columnar conductors 14. Next, as illustrated in FIG. 5C, the coil core 11 and the columnar conductors 13 and 14 are resin-sealed, using the same resin as that for the support layer 41, to form the resin insulating layer 31 including the support layer 41. When the third columnar conductors 32 are supported by the support layer 41 on the release sheet 40, the third columnar conductors 32 are also resin-sealed together by the resin insulating layer 31. The resin insulating layer 31 may be formed of a resin different from that for the support layer 41. A liquid resin may be used to form the support layer 41 may be formed of, and a solid resin may be used for resin sealing. As illustrated in FIGS. 6A and 6B, after the release sheet 40 is peeled off, the resin on both the principal surfaces 31a and 31b of the resin insulating layer 31 is removed by polishing or grinding such that the columnar conductors 13 and 14 (and the third columnar conductors 32) are each exposed at both ends thereof.

Next, as illustrated in FIG. 4A, the component-side wiring electrode traces 15 are formed on the first principal surface 31a of the resin insulating layer 31 to each connect the first ends of the first and second columnar conductors 13 and 14 in a pair to complete the coil component 30. Next, as illustrated in FIG. 4B, the wiring substrate 20 is prepared, which includes the multilayer resin insulating layer 120 in which the substrate-side coil electrode (the substrate-side wiring electrode traces 16, the via conductors 16a) is formed such that the second end of each first columnar conductor 13 is connected to the second end of the second columnar conductor 14 adjacent on one side to the second columnar conductor 14 paired with the first columnar conductor 13. Then, the wiring substrate 20 is stacked on the second principal surface 31b of the resin insulating layer 31 to complete the coil module 1.

The wiring substrate 20 having the multilayer resin insulating layer 120 with the substrate-side coil electrode formed therein can be formed by a process commonly used to form a multilayer resin substrate, and its detailed description will be omitted.

(Modification)

Figure 7:
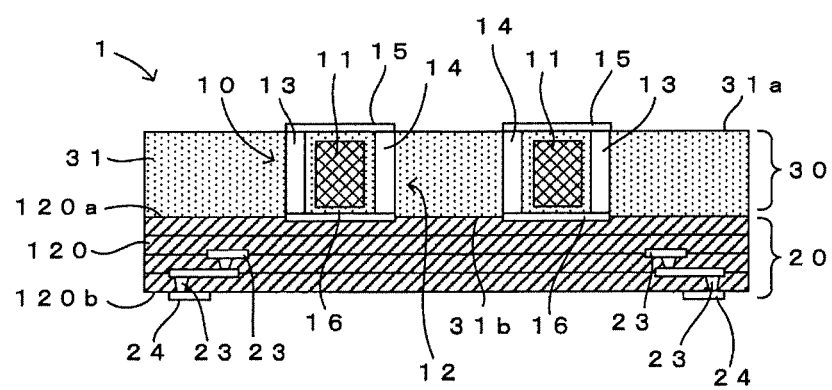
FIG. 7 illustrates a modification of the coil module illustrated in FIGS. 4A and 4B.

A modified coil module will be described with reference to FIG. 7. FIG. 7 illustrates a modification of the coil module illustrated in FIGS. 4A and 4B.

The modification illustrated in FIG. 7 differs from the coil module 1 illustrated in FIGS. 4A and 4B in that a plurality of mounting electrodes 24 (corresponding to "wiring electrodes" in the present disclosure) for external connection are formed on the second principal surface 120b of the multilayer resin insulating layer 120. The mounting electrodes 24 are each connected to the coil component 30, with the corresponding internal wiring electrodes 23 interposed therebetween. The other configurations are the same as those of the coil module 1 illustrated in FIGS. 4A and 4B, and their description will be omitted by using the same reference numerals.

The substrate-side wiring electrode traces 16 illustrated in FIG. 4B and FIG. 7 may be formed by metal pins. In this case, a principal surface of a layer for forming the substrate-side wiring electrode traces 16 in the multilayer resin insulating layer 120 is provided with grooves for arrangement of the metal pins, so that the substrate-side wiring electrode traces 16 can be formed by arranging or mounting the metal pins in the grooves.

As described above, in the present embodiment, the substrate-side coil electrode (the substrate-side wiring electrode traces 16, the via conductors 16a) can be formed by using the multilayer structure of the multilayer resin insulating layer 120 of the wiring substrate 20, on which the coil component 30 is mounted on the first principal surface 120a. This can increase flexibility in the design of the substrate-side coil electrode. Also, for example, by forming the substrate-side coil electrode on an internal layer of the multilayer resin insulating layer 120, the distance between the coil core 11 and the substrate-side coil electrode can be widened as compared to the case of the conventional configuration in which the wiring electrode traces forming the coil electrode are formed on the principal surfaces of the resin insulating layer 31 having the coil core 11 embedded therein. This can reduce stress from the coil electrode 12 to the coil core 11, and thus can improve the coil characteristics. Also, by forming the substrate-side coil electrode on an internal layer of the multilayer resin insulating layer 120, a lower profile than that in the conventional configuration can be achieved.

<Third Embodiment>

Figure 8:
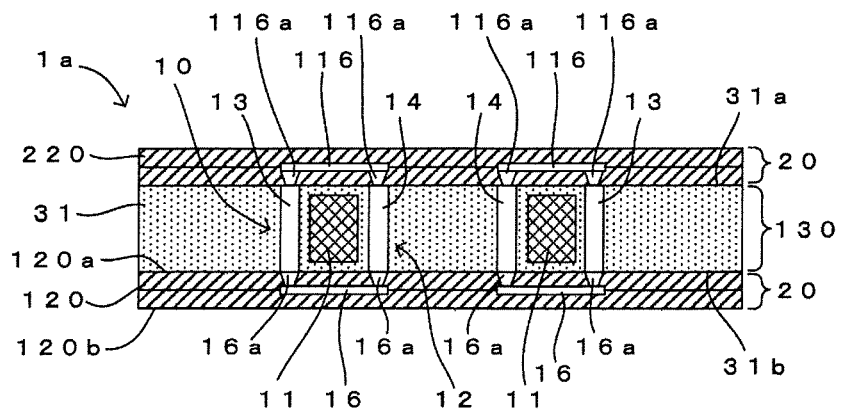
FIG. 8 is a partial cross-sectional view of a coil module according to a third embodiment of the present disclosure.

A coil module according to a third embodiment of the present disclosure will be described with reference to FIG. 8. FIG. 8 is a partial cross-sectional view of a coil module according to the third embodiment of the present disclosure.

A coil module 1a of the present embodiment differs from the second embodiment in that the component (see FIGS. 6A and 6B) formed by embedding the coil core 11 and the first and second columnar conductors 13 and 14 in the resin insulating layer 31 in the second embodiment is configured as a coil component 130. The following description mainly refers to differences from the second embodiment. The other configurations are the same as those described in the second embodiment, and their description will be omitted by using the same reference numerals.

As illustrated in FIG. 8, the wiring substrate 20 is stacked on the first principal surface 31a of the resin insulating layer 31 opposite the multilayer resin insulating layer 120, and includes a multilayer resin insulating layer 220 (corresponding to "second multilayer insulating layer" in the present disclosure) having a substrate-side coil electrode formed therein, together with the multilayer resin insulating layer 120. That is, the first connecting members of the substrate-side coil electrode forming a part of the coil electrode 12 are formed in the multilayer resin insulating layer 220 by substrate-side wiring electrode traces 116 and via conductors 116a.

Also, the first ends of each pair of the first and second columnar conductors 13 and 14 are connected to each other by the corresponding substrate-side wiring electrode trace 116 and via conductors 116a. Thus, the corresponding first ends of the columnar conductors 13 and 14 are connected by the substrate-side coil electrode formed in the multilayer resin insulating layer 220, and the corresponding second ends of the columnar conductors 13 and 14 are connected by the substrate-side coil electrode formed in the multilayer resin insulating layer 120, whereby the coil electrode 12 is formed.

(Modification)

Figure 9:
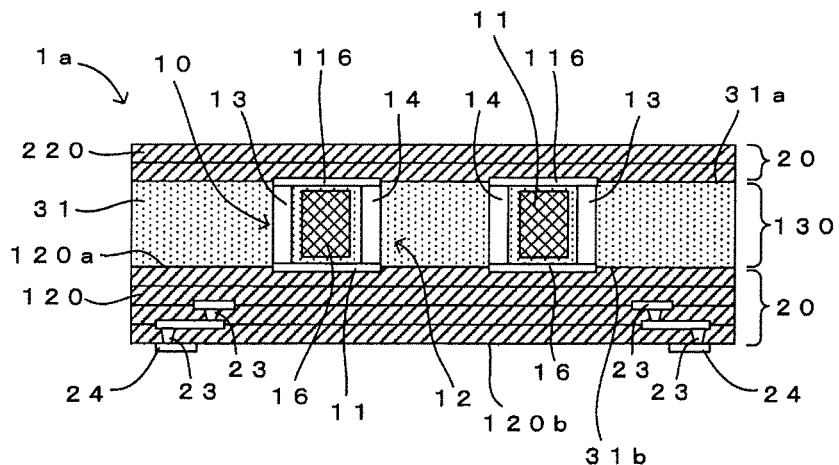
FIG. 9 illustrates a modification of the coil module illustrated in FIG. 8.

A modified coil module will be described with reference to FIG. 9. FIG. 9 illustrates a modification of the coil module illustrated in FIG. 8.

The modification illustrated in FIG. 9 differs from the coil module 1a illustrated in FIG. 8 in that, like the modification illustrated in FIG. 7 in the second embodiment, the plurality of mounting electrodes 24 for external connection are formed on the second principal surface 120b of the multilayer resin insulating layer 120. The mounting electrodes 24 are each connected to the coil component 130, with the corresponding internal wiring electrodes 23 interposed therebetween. The other configurations are the same as those of the coil module 1a illustrated in FIG. 8, and their description will be omitted by using the same reference numerals.

As described above, in the present embodiment, the plurality of first columnar conductors 13 are disposed substantially orthogonal to the direction of the winding axis of the coil electrode 12, arranged on the outer side (first side) of the coil core 11, and embedded in the resin insulating layer 31. Also, the plurality of second columnar conductors 14 are disposed substantially orthogonal to the direction of the winding axis of the coil electrode 12, arranged on the inner side (second side) of the coil core 11 to face the plurality of first columnar conductors 13 with the coil core 11 interposed therebetween, and embedded in the resin insulating layer 31. The first and second columnar conductors 13 and 14 are exposed at the first ends thereof to the first principal surface 31a of the resin insulating layer 31 and exposed at the second ends thereof to the second principal surface 31b of the resin insulating layer 31, whereby the component-side coil electrode is formed.

The multilayer resin insulating layer 220 having the substrate-side coil electrode formed therein, as in the multilayer resin insulating layer 120, is stacked on the first principal surface 31a of the resin insulating layer 31. The first ends of each pair of the first and second columnar conductors 13 and 14 are connected to each other by the corresponding first connecting member (the substrate-side wiring electrode trace 116, the via conductors 116a) of the substrate-side coil electrode formed in the multilayer resin insulating layer 220. At the same time, the second end of each first columnar conductor 13 and the second end of the second columnar conductor 14 adjacent on one side to the second columnar conductor 14 paired with the first columnar conductor 13 are connected to each other by the corresponding second connecting member (the substrate-side wiring electrode trace 16, the via conductors 16a) of the substrate-side coil electrode formed in the multilayer resin insulating layer 120. Thus, the coil electrode 12 is formed.

Therefore, the substrate-side coil electrode can be formed by using the multilayer structure of not only the multilayer resin insulating layer 120 on the second principal surface 31b of the resin insulating layer 31 of the coil component 130, but also of the multilayer resin insulating layer 220 stacked on the first principal surface 31a of the resin insulating layer 31 of the coil component 130. This can further increase flexibility in the design of the substrate-side coil electrode. Also, for example, by forming the substrate-side coil electrode on an internal layer of each of the multilayer resin insulating layers 120 and 220, the distance between the coil core 11 and the substrate-side coil electrode can be further widened as compared to the case of the conventional configuration in which the wiring electrode traces forming the coil electrode 12 are formed on the principal surfaces 31a and 31b of the resin insulating layer 31 having the coil core 11 embedded therein. This can further reduce stress from the coil electrode to the coil core 11, and further improve the coil characteristics.

<Fourth Embodiment>

Figure 10:
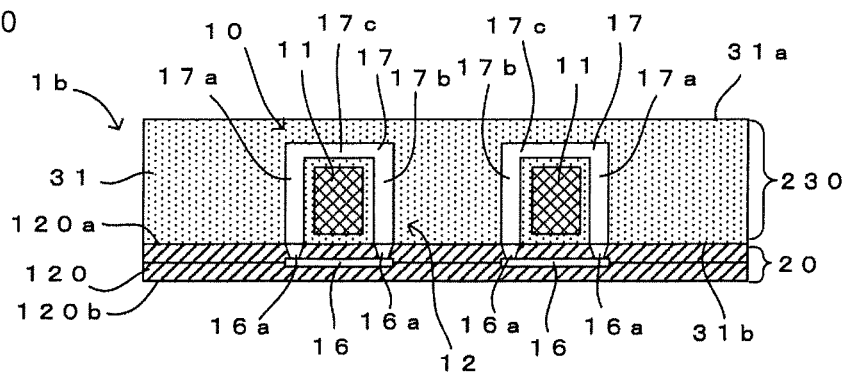
FIG. 10 is a partial cross-sectional view of a coil module according to a fourth embodiment of the present disclosure.

A coil module according to a fourth embodiment of the present disclosure will be described with reference to FIG. 10. FIG. 10 is a partial cross-sectional view of a coil module according to the fourth embodiment of the present disclosure.

A coil module 1b of the present embodiment differs from the second embodiment in that, as illustrated in FIG. 10, a plurality of staple-like (U-shaped) metal pins 17 forming the component-side coil electrode are disposed astride the coil core 11, arranged along the circumferential direction of the coil core 11, and embedded in the resin insulating layer 31, whereby a coil component 230 is formed. The following description mainly refers to differences from the second embodiment. The other configurations are the same as those described in the second embodiment, and their description will be omitted by using the same reference numerals.

As illustrated in FIG. 10, the plurality of metal pins 17 are disposed astride the coil core 11 and arranged in the circumferential direction of the core. First legs of the plurality of metal pins 17 arranged along the outer periphery of the coil core 11 form a plurality of first columnar conductors 17*a* disposed substantially orthogonal to the direction of the winding axis of the coil electrode 12, and arranged on the outer side (first side) of the coil core 11 along the outer periphery of the coil core 11. Also, second legs of the plurality of metal pins 17 arranged along the inner periphery of the coil core 11 form a plurality of second columnar conductors 17*b* disposed substantially orthogonal to the direction of the winding axis of the coil electrode 12, and arranged on the inner side (second side) of the coil core 11 along the inner periphery of the coil core 11 to face the plurality of first columnar conductors 17*a* with the coil core 11 interposed therebetween.

Bridging portions, each configured to connect first ends of both legs of the corresponding metal pin 17, form a plurality of first connecting members 17*c* each connecting first ends of the first and second columnar conductors 17*a* and 17*b* in a pair in the resin insulating layer 31. As described above, in the present embodiment, each first connecting member 17*c* and the corresponding pair of the first and second columnar conductors 17*a* and 17*b* connected at the first ends thereof by the first connecting member 17*c* are integrally formed of the same metal material as the metal pin 17.

Both ends of each metal pin 17 forming second ends of the columnar conductors 17*a* and 17*b* are exposed to the second principal surface 31*b* of the resin insulating layer 31 facing the multilayer resin insulating layer 120. The second end of each first columnar conductor 17*a* and the second end of the second columnar conductor 17*b* formed by the metal pin 17 adjacent on one side to the metal pin 17 forming the first columnar conductor 17*a* are connected to each other by the corresponding second connecting member (the wiring electrode trace 16, the via conductors 16*a*) formed in the multilayer resin insulating layer 120, whereby the coil electrode 12 is formed. That is, as in the second embodiment, the second end of each first columnar conductor 17*a* and the second end of the second columnar conductor 17*b* adjacent on one side to the second columnar conductor 17*b* paired with the first columnar conductor 17*a* are connected by the corresponding second connecting member.

(Modification)

Figure 11:
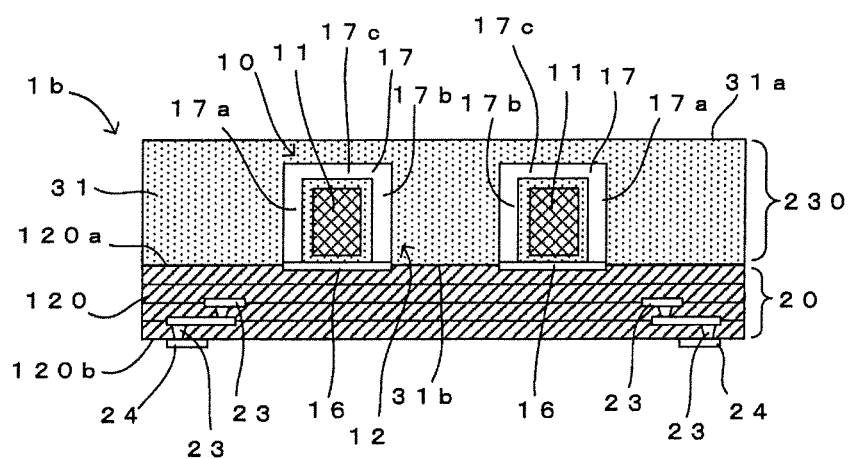
FIG. 11 illustrates a modification of the coil module illustrated in FIG. 10.

A modified coil module will be described with reference to FIG. 11. FIG. 11 illustrates a modification of the coil module illustrated in FIG. 10.

The modification illustrated in FIG. 11 differs from the coil module 1*b* illustrated in FIG. 10 in that, like the modification illustrated in FIG. 7 in the second embodiment, the plurality of mounting electrodes 24 for external connection are formed on the second principal surface 120*b* of the multilayer resin insulating layer 120. The mounting electrodes 24 are each connected to the coil component 230, with the corresponding internal wiring electrodes 23 interposed therebetween. The other configurations are the same as those of the coil module 1*b* illustrated in FIG. 10, and their description will be omitted by using the same reference numerals.

As described above, in the present embodiment, the plurality of first columnar conductors 17*a* are disposed substantially orthogonal to the direction of the winding axis of the coil electrode 12, arranged on the outer side (first side) of the coil core 11 along the outer periphery of the coil core 11, and embedded in the resin insulating layer 31. Also, the plurality of second columnar conductors 17*b* are disposed substantially orthogonal to the direction of the winding axis of the coil electrode 12, arranged on the inner side (second side) of the coil core 11 along the inner periphery of the coil core 11 to face the plurality of first columnar conductors 17*a* with the coil core 11 interposed therebetween, and embedded in the resin insulating layer 31. Additionally, on the opposite side of the first multilayer resin insulating layer 120 having the substrate-side coil electrode formed therein, the first ends of each pair of the first and second columnar conductors 17*a* and 17*b* are connected to each other by the corresponding one of the plurality of first connecting members 17*c* in the resin insulating layer 31. Also, the component-side coil electrode is formed by the metal pins 17, each having a pair of the first and second columnar conductors 17*a* and 17*b* integrally formed with, and of the same metal material as, the first connecting member 17*c* connecting the first ends of the pair.

Additionally, the first and second columnar conductors 17*a* and 17*b* are exposed at the second ends thereof to the second principal surface 31*b* of the resin insulating layer 31 facing the first multilayer resin insulating layer 120 having the substrate-side coil electrode formed therein. Then, the second end of each first columnar conductor 17*a* and the second end of the second columnar conductor 17*b* adjacent on one side to the second columnar conductor 17*b* paired with the first columnar conductor 17*a* are connected to each other by the corresponding second connecting member (the wiring electrode trace 16, the via conductors 16*a*) of the substrate-side coil electrode formed in the first multilayer resin insulating layer 120, whereby the coil electrode 12 is formed. Thus, the component-side coil electrode can be formed by simply arranging the staple-like metal pins 17, each integrally formed of the same metal material, astride the coil core 11. Therefore, it is possible to simplify the manufacturing process and further reduce the cost of the coil component 230. Also, in manufacturing the coil component 230, there is no need to take into account misalignment between each pair of the first and second columnar conductors 17*a* and 17*b* and the corresponding first connecting member 17*c*. Therefore, it is possible to further narrow the pitch of the component-side coil electrode.

<Fifth Embodiment>

Figure 12:
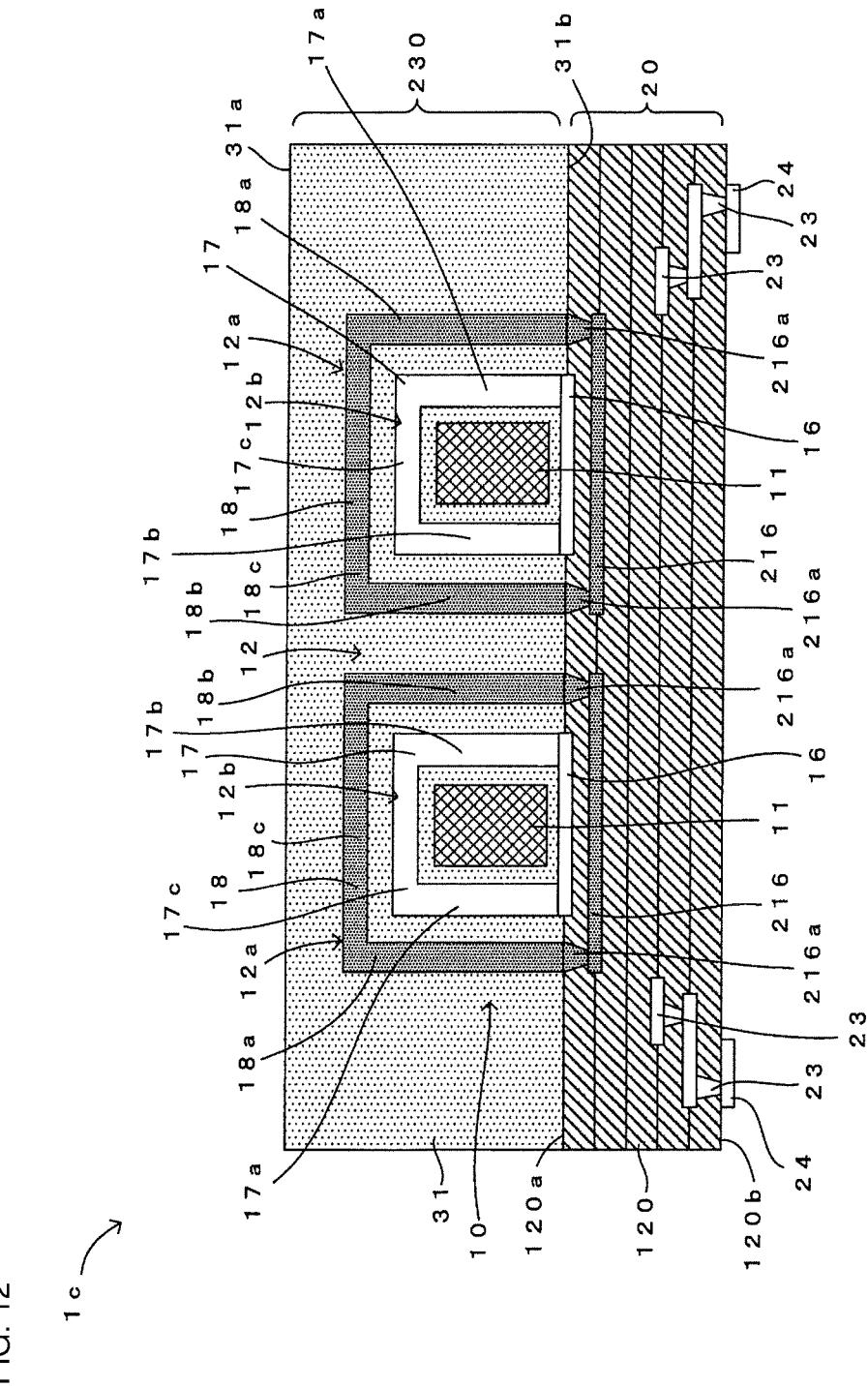
FIG. 12 is a partial cross-sectional view of a coil module according to a fifth embodiment of the present disclosure.
Figure 13A:
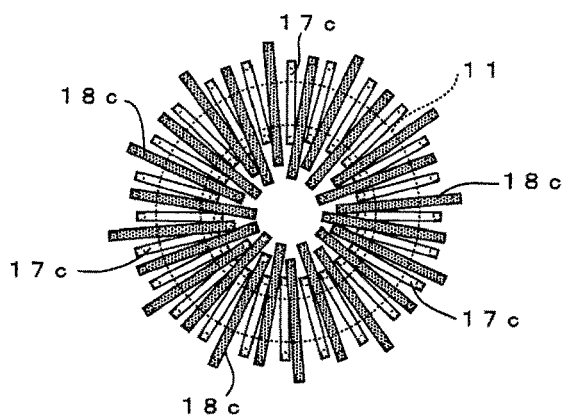
FIGS. 13A-13D illustrate a wiring state of the coil electrode; 13A is a plan view illustrating how metal pins are arranged, 13B is a plan view illustrating how metal pins forming a first electrode group are arranged, 13C is a plan view illustrating how metal pins forming a second electrode group are arranged, and 13D is a plan view illustrating how columnar conductors are arranged.
Figure 13B:
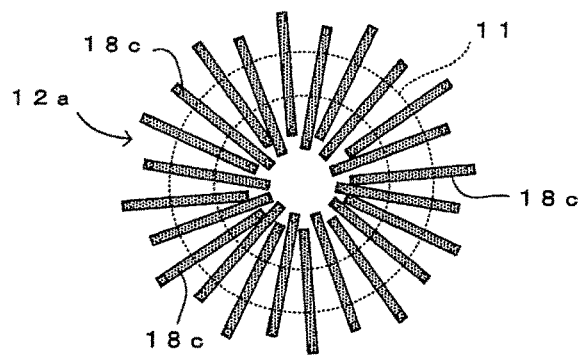
Figure 13C:
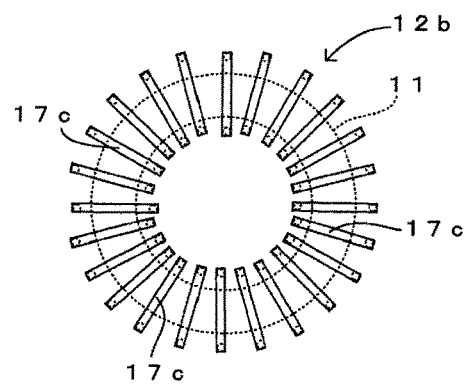
Figure 13D:
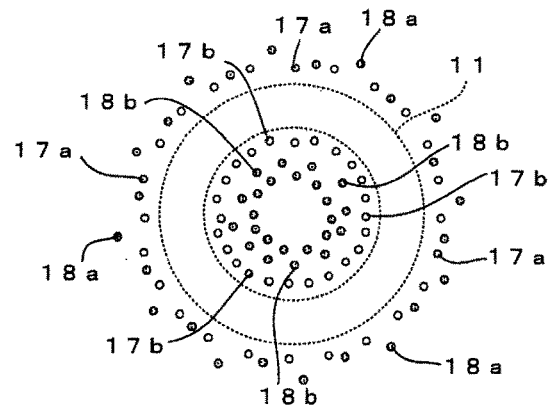

A coil module according to a fifth embodiment of the present disclosure will be described with reference to FIGS. 12 and 13. FIG. 12 is a partial cross-sectional view of a coil module according to the fifth embodiment of the present disclosure. FIGS. 13A-13D illustrate wiring states of the coil electrode. FIG. 13A is a plan view illustrating how metal pins are arranged, FIG. 13B is a plan view illustrating how metal pins forming a first electrode group are arranged, FIG. 13C is a plan view illustrating how metal pins forming a second electrode group are arranged, and FIG. 13D is a plan view illustrating how columnar conductors are arranged. Of the wiring electrodes provided in a coil module 1*c*, the wiring electrodes (metal pins 18, substrate-side wiring electrode traces 216, via conductors 216*a*) forming a first electrode group 12a are filled with dots in FIG. 12 and FIGS. 13A, 13B, and 13D for ease of understanding.

The coil module 1c of the present embodiment differs from the fourth embodiment in that, as illustrated in FIG. 12, the coil electrode 12 is formed by the first electrode group 12a helically wound with a predetermined coil diameter around the coil core 11 and a second electrode group 12b helically wound with a smaller coil diameter than the first electrode group 12a around the coil core 11, and the second electrode group 12b with a small coil diameter is disposed inside the first electrode group 12a with a large coil diameter to form the coil electrode 12 in a multi-winding structure. The following description mainly refers to differences from the fourth embodiment. The other configurations are the same as those described in the fourth embodiment, and their description will be omitted by using the same reference numerals.

As illustrated in FIG. 12, the plurality of staple-like metal pins 18 included in the component-side coil electrode forming the first electrode group 12a, the plurality of staple-like metal pins 17 included in the component-side coil electrode forming the second electrode group 12b, and the coil core 11 are embedded in the resin insulating layer 31 to form the coil component 230.

The plurality of metal pins 18 forming the first electrode group 12a are formed to be greater in outer shape than the metal pins 17 described with reference to FIG. 10 in the fourth embodiment. The metal pins 18 are disposed astride the coil core 11 and the metal pins 17, and arranged in the circumferential direction of the coil core 11. As in the case of the metal pins 17, first legs of the plurality of metal pins 18 arranged along the outer periphery of the coil core 11 form a plurality of first columnar conductors 18a disposed substantially orthogonal to the direction of the winding axis of the coil electrode 12, and arranged on the outer side (first side) of the coil core 11 along the outer periphery of the coil core 11. Also, second legs of the plurality of metal pins 18 arranged along the inner periphery of the coil core 11 form a plurality of second columnar conductors 18b disposed substantially orthogonal to the direction of the winding axis of the coil electrode 12, and arranged on the inner side (second side) of the coil core 11 along the inner periphery of the coil core 11 to face the plurality of first columnar conductors 17a with the coil core 11 interposed therebetween.

Bridging portions, each configured to connect first ends of both legs of the corresponding metal pin 18, form a plurality of first connecting members 18c each connecting first ends of the first and second columnar conductors 18a and 18b in a pair in the resin insulating layer 31. In other words, in the present embodiment, each first connecting member 18c and the corresponding pair of the first and second columnar conductors 18a and 18b connected at the first ends thereof by the first connecting member 18c are integrally formed of the same metal material as the metal pin 18.

Both ends of each metal pin 18 forming second ends of the columnar conductors 18a and 18b are exposed to the second principal surface 31b of the resin insulating layer 31 facing the multilayer resin insulating layer 120. The second end of each first columnar conductor 18a and the second end of the second columnar conductor 18b formed by the metal pin 18 adjacent on one side to the metal pin 18 forming the first columnar conductor 18a are connected to each other by the corresponding second connecting member (the wiring electrode trace 216, the via conductors 216a) formed in the multilayer resin insulating layer 120, whereby the first electrode group 12a is formed. That is, as in the case of the metal pins 17 of the fourth embodiment, the second end of each first columnar conductor 18a and the second end of the second columnar conductor 18b adjacent on one side to the second columnar conductor 18b paired with the first columnar conductor 18a are connected by the corresponding second connecting member.

As in the case of the modification described with reference to FIG. 11 in the fourth embodiment, the plurality of metal pins 17 forming the second electrode group 12b are disposed astride the coil core 11 and arranged in the circumferential direction of the coil core 11. The first legs of the plurality of metal pins 17 arranged along the outer periphery of the coil core 11 form the plurality of first columnar conductors 17a disposed substantially orthogonal to the direction of the winding axis of the coil electrode 12, and arranged on the outer side (first side) of the coil core 11 along the outer periphery of the coil core 11. Also, the second legs of the plurality of metal pins 17 arranged along the inner periphery of the coil core 11 form the plurality of second columnar conductors 17b disposed substantially orthogonal to the direction of the winding axis of the coil electrode 12, and arranged on the inner side (second side) of the coil core 11 along the inner periphery of the coil core 11 to face the plurality of first columnar conductors 17a with the coil core 11 interposed therebetween.

Bridging portions, each configured to connect the first ends of both legs of the corresponding metal pin 17, form the plurality of first connecting members 17c each connecting the first ends of the first and second columnar conductors 17a and 17b in a pair in the resin insulating layer 31. Both ends of each metal pin 17 forming the second ends of the columnar conductors 17a and 17b are exposed to the second principal surface 31b of the resin insulating layer 31 facing the multilayer resin insulating layer 120. The second end of each first columnar conductor 17a and the second end of the second columnar conductor 17b formed by the metal pin 17 adjacent on one side to the metal pin 17 forming the first columnar conductor 17a are connected to each other by the corresponding second connecting member (the wiring electrode trace 16) formed in the multilayer resin insulating layer 120, whereby the second electrode group 12b is formed. That is, as in the second embodiment, the second end of each first columnar conductor 17a and the second end of the second columnar conductor 17b adjacent on one side to the second columnar conductor 17b paired with the first columnar conductor 17a are connected by the corresponding second connecting member.

Also, as illustrated in FIG. 12, both ends of each metal pin 18 are connected by the corresponding second connecting member (the substrate-side wiring electrode trace 216) formed on a layer of the multilayer resin insulating layer 120 inside the plurality of second connecting members (the substrate-side wiring electrode traces 16) each connecting both ends of the corresponding metal pin 17.

Also in the present embodiment, as illustrated in FIG. 13A, the metal pins 18 (the first connecting members 18c) forming the first electrode group 12a and the metal pins 17 (the first connecting members 17c) forming the second electrode group 12b are arranged alternately in plan view. As illustrated in FIG. 12 and FIGS. 13B and 13D, the wiring lengths of respective turns in the first electrode group 12a are substantially the same, the first columnar conductors 18a are arranged in a staggered manner along the outer periphery of the coil core 11, and the second columnar conductors 18b are arranged in a staggered manner along the inner periphery of the coil core 11. Also, as illustrated in FIG. 12 and FIGS. 13C and 13D, the wiring lengths of respective turns in the second electrode group 12b are substantially the same, and the first and second columnar conductors 17a and 17b are concentrically arranged.

In the present embodiment, the first electrode group 12a in which the plurality of metal pins 18 are helically connected in series by the second connecting members (the substrate-side wiring electrode traces 216, the via conductors 216a) and the second electrode group 12b in which the plurality of metal pins 17 are helically connected in series by the second connecting members (the substrate-side wiring electrode traces 16) are connected in series to form the coil electrode 12 of the coil 10. Alternatively, the metal pins 18 forming the first electrode group 12a and the metal pins 17 forming the second electrode group 12b may be alternately helically connected in series to form the coil electrode 12. In this case, the first end of each metal pin 18 and the second end of the metal pin 17 adjacent on one side to the metal pin 18 may be connected by the corresponding second connecting member provided in the wiring substrate 20, and the first end of each metal pin 17 and the second end of the metal pin 18 adjacent on one side to the metal pin 17 may be connected by the corresponding second connecting member provided in the wiring substrate 20.

As described above, in the present embodiment, the coil electrode 12 is formed in a multi-winding structure. Since this can increase the number of turns in the coil 10, it is possible to further improve the coil characteristics. Although the coil electrode 12 is configured to include two electrode groups, the first and second coil electrode groups 12a and 12b, in the present embodiment, the coil electrode 12 may be configured to include three or more coil electrode groups.

The wiring lengths of respective turns in the first electrode group 12a having a large coil diameter are substantially the same, and the first and second columnar conductors 18a and 18b of the first electrode group 12a are individually arranged in a staggered manner in plan view. Since this can prevent contact between the first connecting members 18c and 17c of the first and second electrode groups 12a and 12b alternately arranged in plan view, it is possible to further narrow the pitch of the coil electrode 12. Since narrowing the pitch of the coil electrode 12 can further increase the number of turns in the coil 10, it is possible to further improve the coil characteristics.

(Modification)

Figure 14:
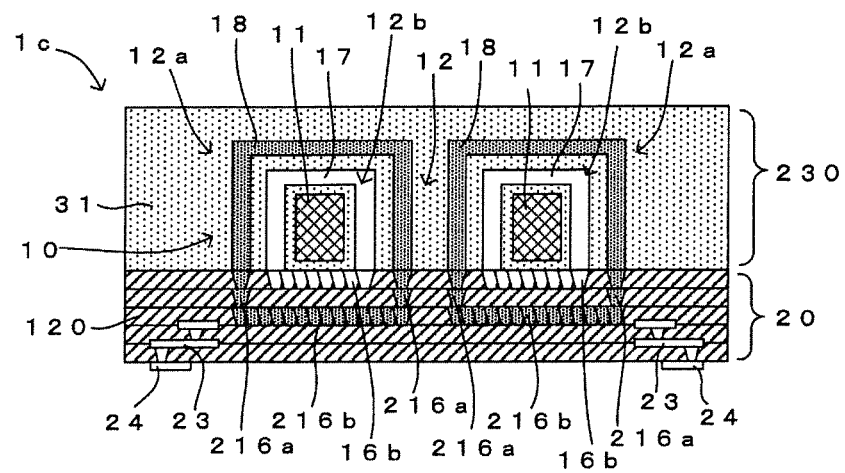
FIG. 14 illustrates a modification of the coil module illustrated in FIG. 12.
Figure 15:
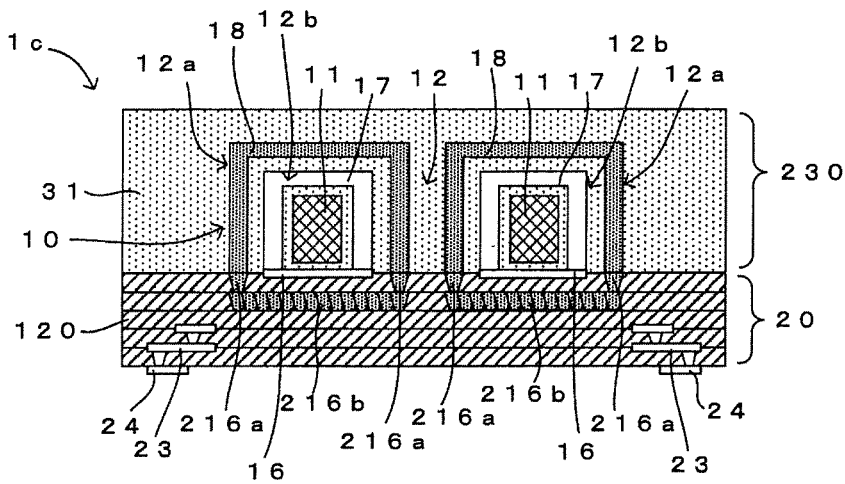
FIG. 15 illustrates another modification of the coil module illustrated in FIG. 12.

Modified coil modules will be described with reference to FIGS. 14 and 15. FIGS. 14 and 15 each illustrate a modification of the coil module illustrated in FIG. 12. Of the wiring electrodes provided in the coil module 1c, the wiring electrodes (the metal pins 18, the via conductors 216a, connected-via conductors 216b) forming the first electrode group 12a are filled with dots in FIGS. 14 and 15 for ease of understanding. The following description mainly refers to differences from the coil module 1c illustrated in FIG. 12. The other configurations are the same as those of the coil module 1c illustrated in FIG. 12, and their description will be omitted by using the same reference numerals.

The modification illustrated in FIG. 14 differs from the coil module 1c illustrated in FIG. 12 in that the corresponding end portions of each metal pin 18 are connected to each other by the via conductors 216a and the connected-via conductor 216b provided as the second connecting member of the substrate-side coil electrode in the wiring substrate 20. Also, the corresponding end portions of each metal pin 17 are connected to each other by a connected-via conductor 16b provided as the second connecting member of the substrate-side coil electrode in the wiring substrate 20. As illustrated in FIG. 14, the connected-via conductors 16b and 216b are each formed by arranging a plurality of via conductors in the planar direction (a direction parallel to the second principal surface 120b of the multilayer resin insulating layer 120) of the insulating layer such that they partly overlap each other. This can make the resistance of the wiring electrodes lower than that in the case of the wiring electrode traces 16 and 216.

The modification illustrated in FIG. 15 differs from the coil module 1c illustrated in FIG. 12 in that the corresponding end portions of each metal pin 18 are connected to each other by the via conductors 216a and the connected-via conductor 216b provided as the second connecting member of the substrate-side coil electrode in the wiring substrate 20. This can make the resistance of the wiring electrodes lower than that in the case of the wiring electrode traces 216.

<Sixth Embodiment>

Figure 16A:
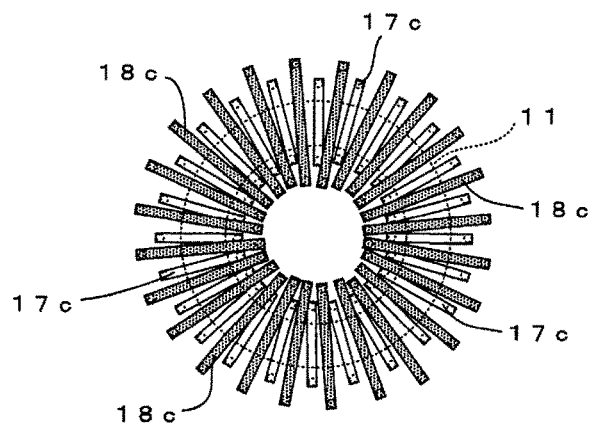
FIGS. 16A-16D illustrate wiring states of the coil electrode of the coil included in a coil module according to a sixth embodiment of the present disclosure; 16A is a plan view illustrating how metal pins are arranged, 16B is a plan view illustrating how metal pins forming the first electrode group are arranged, 16C is a plan view illustrating how metal pins forming the second electrode group are arranged, and 16D is a plan view illustrating how columnar conductors are arranged.
Figure 16B:
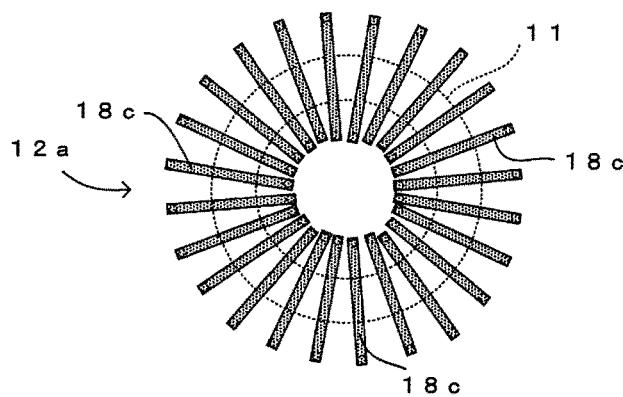
Figure 16C:
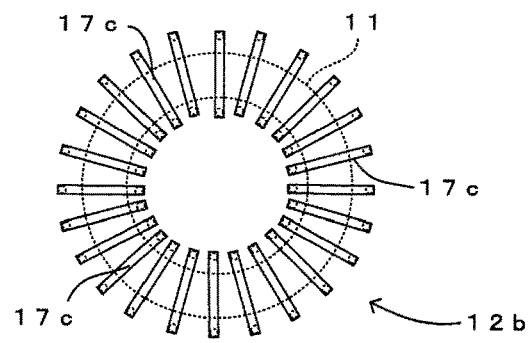
Figure 16D:
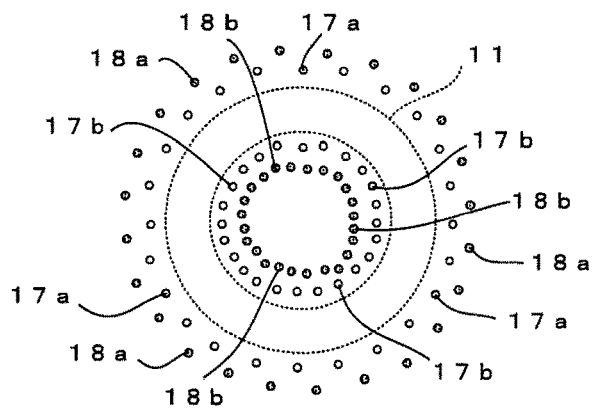

A coil module according to a sixth embodiment of the present disclosure will be described with reference to FIGS. 16A-16D. FIGS. 16A-16D illustrate wiring states of the coil electrode of the coil included in a coil module according to the sixth embodiment of the present disclosure. FIG. 16A is a plan view illustrating how metal pins are arranged, FIG. 16B is a plan view illustrating how metal pins forming the first electrode group are arranged, FIG. 16C is a plan view illustrating how metal pins forming the second electrode group are arranged, and FIG. 16D is a plan view illustrating how columnar conductors are arranged. Of the wiring electrodes provided in the coil module 1c, the wiring electrodes (portions formed by the metal pins 18) forming the first electrode group 12a are filled with dots in FIGS. 16A, 16B, and 16D for ease of understanding.

The present embodiment differs from the fifth embodiment in that, as illustrated in FIGS. 16B and 16D, the first and second columnar conductors 18a and 18b of the first electrode group 12a are concentrically arranged as in the case of the second electrode group 12b. The other configurations are the same as those described in the fifth embodiment, and their description will be omitted by using the same reference numerals.

<Seventh Embodiment>

Figure 17A:
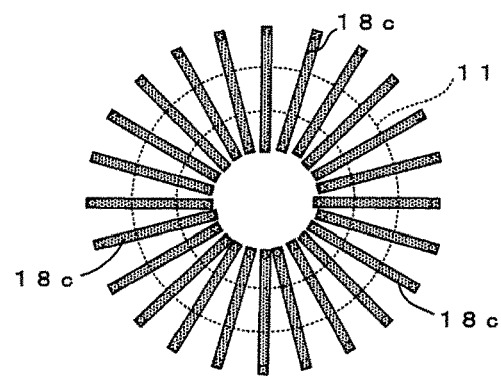
FIGS. 17A-17D illustrate wiring states of the coil electrode of the coil included in a coil module according to a seventh embodiment of the present disclosure; 17A is a plan view illustrating how metal pins are arranged, 17B is a plan view illustrating how metal pins forming the first electrode group are arranged, 17C is a plan view illustrating how metal pins forming the second electrode group are arranged, and 17D is a plan view illustrating how columnar conductors are arranged.
Figure 17B:
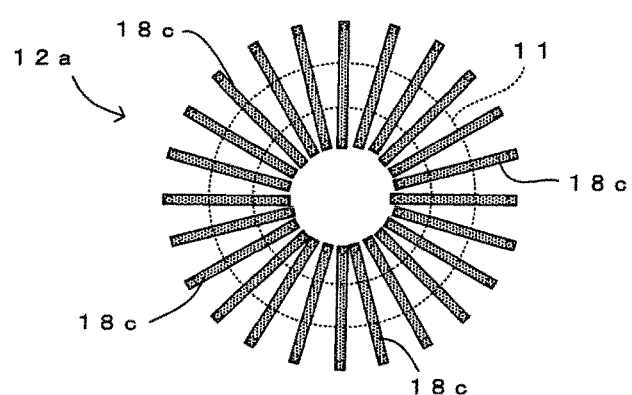
Figure 17C:
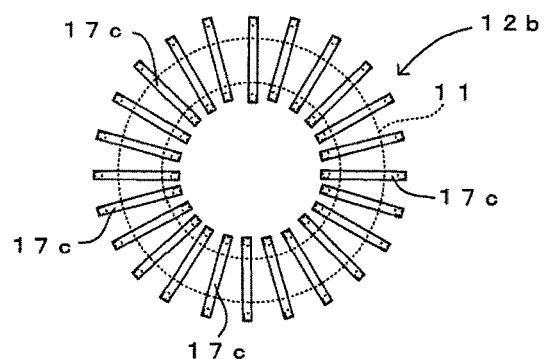
Figure 17D:
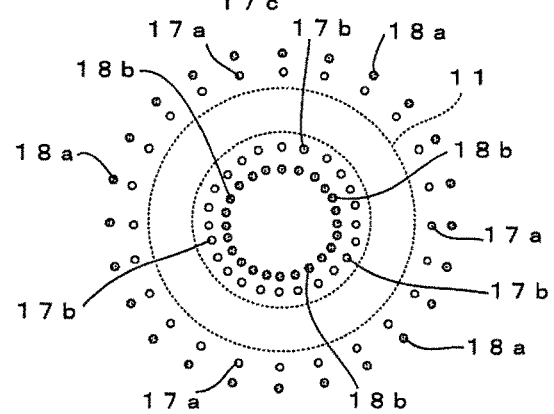

A coil module according to a seventh embodiment of the present disclosure will be described with reference to FIGS. 17A-17D. FIGS. 17A-17D illustrate wiring states of the coil electrode of the coil included in a coil module according to the seventh embodiment of the present disclosure. FIG. 17A is a plan view illustrating how metal pins are arranged, FIG. 17B is a plan view illustrating how metal pins forming the first electrode group are arranged, FIG. 17C is a plan view illustrating how metal pins forming the second electrode group are arranged, and FIG. 17D is a plan view illustrating how columnar conductors are arranged. Of the wiring electrodes provided in the coil module 1c, the wiring electrodes (portions formed by the metal pins 18) forming the first electrode group 12a are filled with dots in FIGS. 17A, 17B, and 17D for ease of understanding.

The present embodiment differs from the sixth embodiment in that, as illustrated in FIGS. 17A, 17B, and 17D, the metal pins 17 and 18 are arranged to coincide in plan view. The other configurations are the same as those described in the sixth embodiment, and their description will be omitted by using the same reference numerals.

<Eighth Embodiment>

Figure 18:
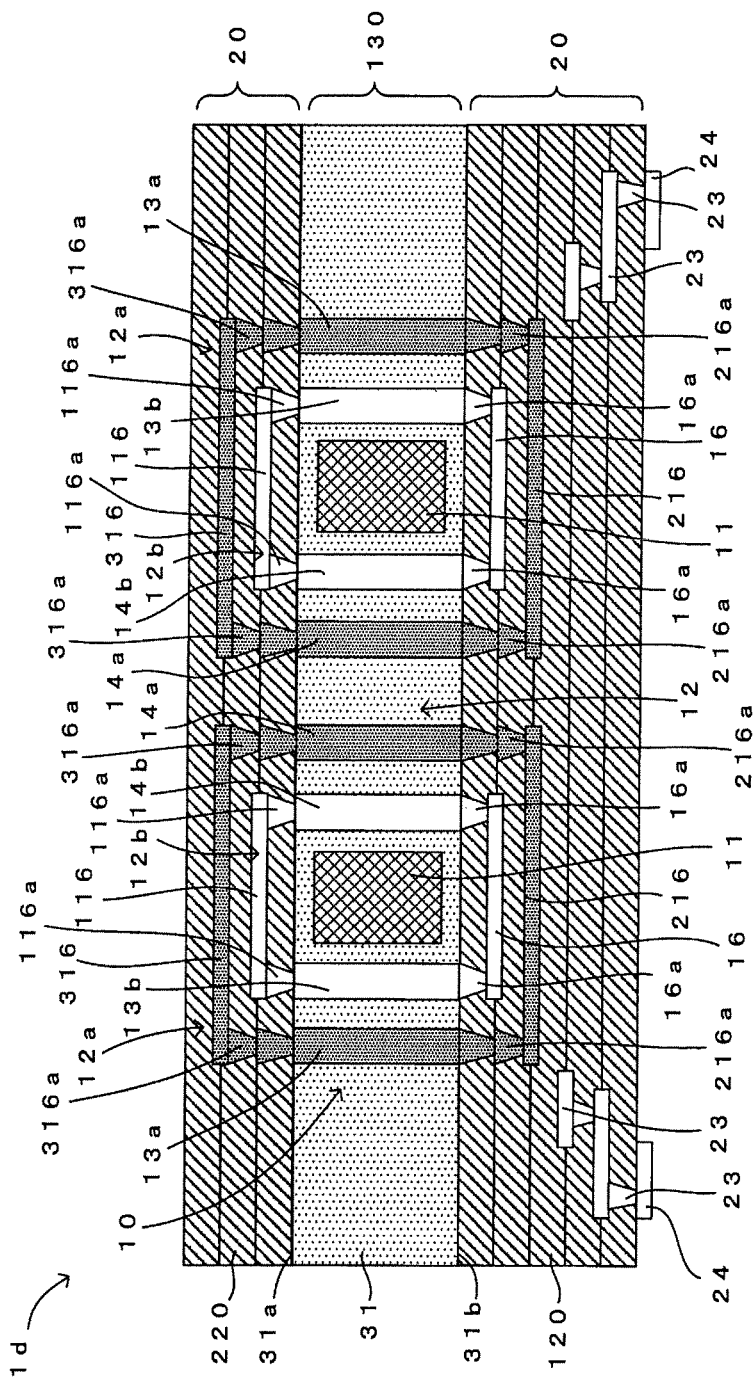
FIG. 18 is a partial cross-sectional view of a coil module according to an eighth embodiment of the present disclosure.

A coil module according to an eighth embodiment of the present disclosure will be described with reference to FIG. 18. FIG. 18 is a partial cross-sectional view of a coil module according to the eighth embodiment of the present disclosure. Of the wiring electrodes provided in a coil module 1d, the wiring electrodes (first and second columnar conductors 13a and 14a, substrate-side wiring electrode traces 216 and 316, via conductors 216a and 316a) forming the first electrode group 12a are filled with dots in FIG. 18 for ease of understanding.

The coil module 1d of the present embodiment differs from the coil module 1c of the fifth embodiment in that, as illustrated in FIG. 18, the coil electrode 12 is formed in a multi-winding structure by the first and second electrode groups 12a and 12b formed using the coil component 130 described with reference to FIG. 8 in the third embodiment. The following description mainly refers to differences from the fifth embodiment. The other configurations are the same as those described in the third and fifth embodiments, and their description will be omitted by using the same reference numerals.

As illustrated in FIG. 18, the first and second columnar conductors 13a and 14a of the component-side coil electrode forming the first electrode group 12a having a predetermined coil diameter and first and second columnar conductors 13b and 14b of the component-side coil electrode forming the second electrode group 12b having a smaller coil diameter than the first electrode group 12a are embedded in the resin insulating layer 31 to form the coil component 130.

The first columnar conductors 13a forming the first electrode group 12a are disposed substantially orthogonal to the direction of the winding axis of the coil electrode 12, and arranged on the outer side (first side) of the coil core 11 along the outer periphery of the coil core 11. The second columnar conductors 14a forming the first electrode group 12a are disposed substantially orthogonal to the direction of the winding axis of the coil electrode 12, and arranged on the inner side (second side) of the coil core 11 along the inner periphery of the coil core 11 to face the plurality of first columnar conductors 13a with the coil core 11 interposed therebetween.

The first ends of each pair of the first and second columnar conductors 13a and 14a are connected to each other by the corresponding first connecting member (the substrate-side wiring electrode trace 316, the via conductors 316a) formed in the multilayer resin insulating layer 220 on the first principal surface 31a of the resin insulating layer 31. At the same time, the second end of each first columnar conductor 13a and the second end of the second columnar conductor 14a adjacent on one side to the second columnar conductor 14a paired with the first columnar conductor 13a are connected to each other by the corresponding second connecting member (the substrate-side wiring electrode trace 216, the via conductors 216a) formed in the multilayer resin insulating layer 120 on the second principal surface 31b of the resin insulating layer 31. Thus, the first electrode group 12a is formed.

The first columnar conductors 13b forming the second electrode group 12b are disposed substantially orthogonal to the direction of the winding axis of the coil electrode 12, and arranged on the outer side (first side) of the coil core 11 along the outer periphery of the coil core 11. The second columnar conductors 14b forming the second electrode group 12b are disposed substantially orthogonal to the direction of the winding axis of the coil electrode 12, and arranged on the inner side (second side) of the coil core 11 along the inner periphery of the coil core 11 to face the plurality of first columnar conductors 13b with the coil core 11 interposed therebetween. Note that the first and second columnar conductors 13b and 14b forming the second electrode group 12b are disposed inside the first and second columnar conductors 13a and 14a forming the first electrode group 12a.

The first ends of each pair of the first and second columnar conductors 13b and 14b are connected to each other by the corresponding first connecting member (the substrate-side wiring electrode trace 116, the via conductors 116a) formed in the multilayer resin insulating layer 220 on the first principal surface 31a of the resin insulating layer 31. At the same time, the second end of each first columnar conductor 13b and the second end of the second columnar conductor 14b adjacent on one side to the second columnar conductor 14b paired with the first columnar conductor 13b are connected to each other by the corresponding second connecting member (the substrate-side wiring electrode trace 16, the via conductors 16a) formed in the multilayer resin insulating layer 120 on the second principal surface 31b of the resin insulating layer 31. Thus, the second electrode group 12b is formed.

As illustrated in FIG. 18, the corresponding first ends of the first and second columnar conductors 13a and 14a forming the first electrode group 12a are connected by the first connecting members (the substrate-side wiring electrode traces 316) formed on a layer of the multilayer resin insulating layer 220 inside the first connecting members (the substrate-side wiring electrode traces 116) connecting the corresponding first ends of the first and second columnar conductors 13b and 14b forming the second electrode group 12b. Similarly, the corresponding second ends of the first and second columnar conductors 13a and 14a forming the first electrode group 12a are connected by the second connecting members (the substrate-side wiring electrode traces 216) formed on a layer of the multilayer resin insulating layer 120 inside the second connecting members (the substrate-side wiring electrode traces 16) connecting the corresponding second ends of the first and second columnar conductors 13b and 14b forming the second electrode group 12b.

<Ninth Embodiment>

Figure 19:
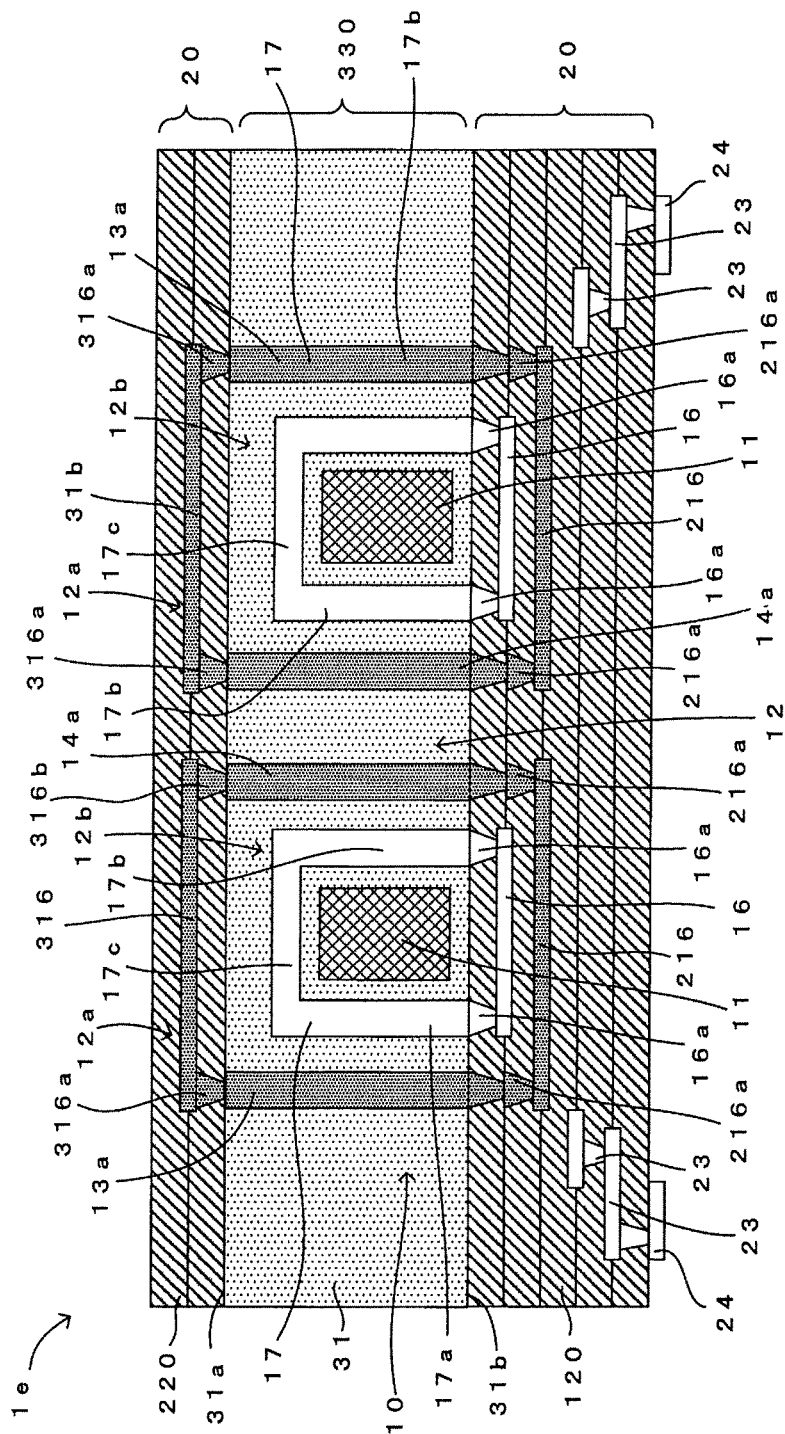
FIG. 19 is a partial cross-sectional view of a coil module according to a ninth embodiment of the present disclosure.

A coil module according to a ninth embodiment of the present disclosure will be described with reference to FIG. 19. FIG. 19 is a partial cross-sectional view of a coil module according to the ninth embodiment of the present disclosure. Of the wiring electrodes provided in a coil module 1e, the wiring electrodes (the first and second columnar conductors 13a and 14a, the substrate-side wiring electrode traces 216 and 316, the via conductors 216a and 316a) forming the first electrode group 12a are filled with dots in FIG. 19 for ease of understanding.

The coil module 1e of the present embodiment differs from the coil module 1d of the eighth embodiment in that, as illustrated in FIG. 19, the coil electrode 12 is formed in a multi-winding structure by the first and second electrode groups 12a and 12b, and the first and second columnar conductors 13a and 14a of the component-side coil electrode forming the first electrode group 12a having a predetermined coil diameter and the metal pins 17 of the component-side coil electrode forming the second electrode group 12b having a smaller coil diameter than the first electrode group 12a are embedded in the resin insulating layer 31 to form the coil component 330. The following description mainly refers to differences from the eighth embodiment. The other configurations are the same as those described in the eighth embodiment, and their description will be omitted by using the same reference numerals.

The first columnar conductors 13a forming the first electrode group 12a are disposed substantially orthogonal to the direction of the winding axis of the coil electrode 12, and arranged on the outer side (first side) of the coil core 11 along the outer periphery of the coil core 11. The second columnar conductors 14a forming the first electrode group 12a are disposed substantially orthogonal to the direction of the winding axis of the coil electrode 12, and arranged on the inner side (second side) of the coil core 11 along the inner periphery of the coil core 11 to face the plurality of first columnar conductors 13a with the coil core 11 interposed therebetween.

The first ends of each pair of the first and second columnar conductors 13a and 14a are connected to each other by the corresponding first connecting member (the substrate-side wiring electrode trace 316, the via conductors 316a) formed in the multilayer resin insulating layer 220 on the first principal surface 31a of the resin insulating layer 31. At the same time, the second end of each first columnar conductor 13a and the second end of the second columnar conductor 14a adjacent on one side to the second columnar conductor 14a paired with the first columnar conductor 13a are connected to each other by the corresponding second connecting member (the substrate-side wiring electrode trace 216, the via conductors 216a) formed in the multilayer resin insulating layer 120 on the second principal surface 31b of the resin insulating layer 31. Thus, the first electrode group 12a is formed.

As in the case of the coil module 1b described with reference to FIG. 10 in the fourth embodiment, the plurality of metal pins 17 forming the second electrode group 12b are disposed astride the coil core 11 and arranged in the circumferential direction of the core. The first legs of the plurality of metal pins 17 arranged along the outer periphery of the coil core 11 form the plurality of first columnar conductors 17a disposed substantially orthogonal to the direction of the winding axis of the coil electrode 12, and arranged on the outer side (first side) of the coil core 11 along the outer periphery of the coil core 11. Also, the second legs of the plurality of metal pins 17 arranged along the inner periphery of the coil core 11 form the plurality of second columnar conductors 17b disposed substantially orthogonal to the direction of the winding axis of the coil electrode 12, and arranged on the inner side (second side) of the coil core 11 along the inner periphery of the coil core 11 to face the plurality of first columnar conductors 17a with the coil core 11 interposed therebetween.

Bridging portions, each configured to connect the first ends of both legs of the corresponding metal pin 17, form the plurality of first connecting members 17c each connecting the first ends of the first and second columnar conductors 17a and 17b in a pair in the resin insulating layer 31. Both ends of each metal pin 17 forming the second ends of the columnar conductors 17a and 17b are exposed to the second principal surface 31b of the resin insulating layer 31 facing the multilayer resin insulating layer 120. The second end of each first columnar conductor 17a and the second end of the second columnar conductor 17b formed by the metal pin 17 adjacent on one side to the metal pin 17 forming the first columnar conductor 17a are connected to each other by the corresponding second connecting member (the wiring electrode trace 16, the via conductors 16a) formed in the multilayer resin insulating layer 120, whereby the second electrode group 12b is formed. That is, as in the case of the metal pins 17 of the fifth embodiment, the second end of each first columnar conductor 17a and the second end of the second columnar conductor 17b adjacent on one side to the second columnar conductor 17b paired with the first columnar conductor 17a are connected by the corresponding second connecting member.

As described above, in the present embodiment, the coil component 330 is formed in which the columnar conductors 13a and 14a and the metal pins 17 embedded. This provides high design flexibility in forming the substrate-side coil electrode of the first electrode group 12a in the wiring substrate 20, and makes it possible to easily form the second electrode group 12b using the metal pins 17. Therefore, the coil electrode 12 having a multi-winding structure can be easily formed.

As illustrated in FIG. 19, the corresponding second ends of the first and second columnar conductors 13a and 14a forming the first electrode group 12a are connected by the second connecting members (the substrate-side wiring electrode traces 216) formed on a layer of the multilayer resin insulating layer 120 inside the second connecting members (the substrate-side wiring electrode traces 16) connecting the corresponding second ends of the first and second columnar conductors 17a and 17b forming the second electrode group 12b.

Figure 20A:
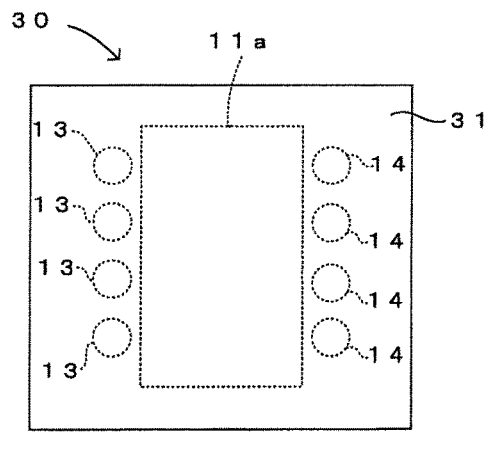
FIGS. 20A and 20B illustrate modified coil cores; 20A illustrates a linear coil core, and 20B illustrates a substantially C-shaped coil core.
Figure 20B:
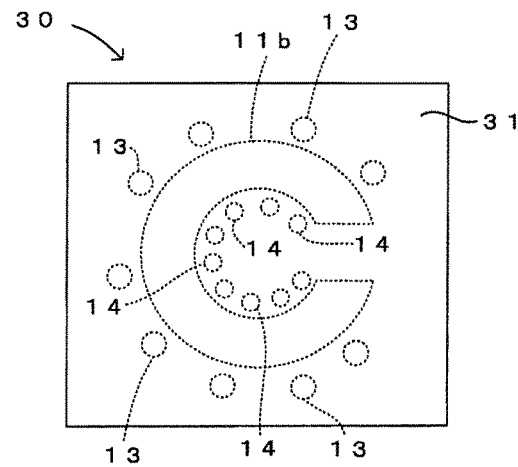

The present disclosure is not limited to the embodiments described above, and various changes other than those described above can be made and the above-described configurations can be combined in any way, without departing from the scope of the disclosure. For example, although the coil core 11 with a toroidal shape has been described as an example in the embodiments, the shape of the coil core is not limited to this. A coil core of various shapes, such as a linear coil core 11a illustrated in FIG. 20A or a substantially C-shaped coil core 11b illustrated in FIG. 20B, can be adopted. Depending on the coil included in the coil module, a coil having various functions, such as a common-mode noise filter and a choke coil, can be provided.

The first to third columnar conductors may be formed by via conductors that are produced, for example, by plating the inside of through holes provided in the resin insulating layer 31 or wiring substrate 20, or by charging a conductive paste into the through holes.

The insulating layer and the first and second insulating layers of the present disclosure may be formed of a ceramic material or a glass material.

INDUSTRIAL APPLICABILITY

The present disclosure is widely applicable to coil modules that include a coil having a coil core and a coil electrode helically wound around the coil core.

REFERENCE SIGNS LIST 1, 1a, 1b, 1c, 1d, 1e: coil module
2: circuit component (other component)
10: coil
11, 11a, 11b: coil core
12: coil electrode
12a: first electrode group
12b: second electrode group
13, 13a, 13b: first columnar conductor (component-side coil electrode)
14, 14a, 14b: second columnar conductor (component-side coil electrode)
15: component-side wiring electrode trace (component-side coil electrode, first connecting member)
16, 216: substrate-side wiring electrode trace (substrate-side coil electrode, second connecting member)

16a, 216a: via conductor (substrate-side coil electrode, second connecting member)
16b, 216b: connected-via conductor (substrate-side coil electrode, second connecting member)
116, 316: substrate-side wiring electrode trace (substrate-side coil electrode, first connecting member)
116a, 316a: via conductor (substrate-side coil electrode, first connecting member)
17, 18: metal pin (component-side coil electrode, first columnar conductor, second columnar conductor, first connecting member)
17a, 18a: first columnar conductor (component-side coil electrode)
17b, 18b: second columnar conductor (component-side coil electrode)
17c, 18c: first connecting member (component-side coil electrode)
20: wiring substrate
21, 22: land electrode (other wiring electrode)
23: internal wiring electrode (other wiring electrode)
24: mounting electrode (other wiring electrode)
120: multilayer resin insulating layer (first multilayer insulating layer)
120a: first principal surface
220: multilayer resin insulating layer (second multilayer insulating layer)
30, 130, 230, 330: coil component
31: resin insulating layer (insulating layer)
31a: first principal surface
31b: second principal surface
32: third columnar conductor

The invention claimed is:

1. A coil module that includes a coil having a coil core and a coil electrode helically wound around the coil core, the coil module comprising:
 a coil component including an insulating layer comprising first and second principal surfaces, the second principal surface facing away from the first principal surface, the insulating layer having the coil core embedded therein, and the coil electrode comprising a component-side coil electrode provided at the insulating layer and having a non-helical shape; and
 a wiring substrate including a multilayer insulating layer having first and second principal surfaces, the second principal surface of the multilayer insulating layer facing away from the first principal surface of the multilayer insulating layer, the wiring substrate having the coil component disposed thereon such that the second principal surface of the insulating layer contacts the first principal surface of the multilayer insulating layer, and the wiring substrate is provided with a substrate-side coil electrode, the coil electrode further comprising the substrate-side coil electrode and the substrate-side coil electrode having a non-helical shape,
 wherein the component-side coil electrode of the coil component is connected to the substrate-side coil electrode of the wiring substrate to helically constitute the coil electrode, and wherein the substrate-side coil electrode is encapsulated within the multilayer insulating layer.

2. The coil module according to claim 1, wherein the multilayer insulating layer includes a first multilayer insulating layer,
 and the component-side coil electrode is connected to the substrate-side coil electrode which is embedded in the first multilayer insulating layer.

3. The coil module according to claim 2, wherein the component-side coil electrode includes
 a plurality of first columnar conductors embedded in the insulating layer, disposed to intersect a direction of a winding axis of the coil electrode, arranged on a first side of the coil core, exposed at first ends thereof to the first principal surface of the insulating layer, and exposed at second ends thereof to the second principal surface of the insulating layer,
 a plurality of second columnar conductors embedded in the insulating layer, disposed to intersect the direction of the winding axis of the coil electrode, arranged on a second side of the coil core to face the plurality of first columnar conductors with the coil core interposed therebetween, exposed at first ends thereof to the first principal surface of the insulating layer, and exposed at second ends thereof to the second principal surface of the insulating layer, and
 a plurality of first connecting members provided on the first principal surface of the insulating layer, and each configured to connect the first ends of the first and second columnar conductors in a pair; and
 the substrate-side coil electrode includes
 a plurality of second connecting members each configured to connect the second end of the corresponding first columnar conductor and the second end of the second columnar conductor adjacent on one side to the second columnar conductor paired with the corresponding first columnar conductor.

4. The coil module according to claim 2, wherein the multilayer insulating layer further includes a second multilayer insulating layer together with the first multilayer insulating layer, the second multilayer insulating layer having the substrate-side coil electrode embedded therein;
 the component-side coil electrode includes
 a plurality of first columnar conductors embedded in the insulating layer, disposed to intersect a direction of a winding axis of the coil electrode, arranged on a first side of the coil core, exposed at first ends thereof to the first principal surface of the insulating layer, and exposed at second ends thereof to the second principal surface of the insulating layer, and
 a plurality of second columnar conductors embedded in the insulating layer, disposed to intersect the direction of the winding axis of the coil electrode, arranged on a second side of the coil core to face the plurality of first columnar conductors with the coil core interposed therebetween, exposed at first ends thereof to the first principal surface of the insulating layer, and exposed at second ends thereof to the second principal surface of the insulating layer; and
 the substrate-side coil electrode includes
 a plurality of first connecting members embedded in the second multilayer insulating layer, and each configured to connect the first ends of the first and second columnar conductors in a pair, and
 a plurality of second connecting members embedded in the first multilayer insulating layer, and each configured to connect the second end of the corresponding first columnar conductor and the second end of the second columnar conductor adjacent on one side to the second columnar conductor paired with the corresponding first columnar conductor.

5. The coil module according to claim 2, wherein the component-side coil electrode includes
 a plurality of first columnar conductors embedded in the insulating layer, disposed to intersect a direction of a winding axis of the coil electrode, and arranged on a first side of the coil core, a plurality of second columnar conductors embedded in the insulating layer, disposed to intersect the direction of the winding axis of the coil electrode, and arranged on a second side of the coil core to face the plurality of first columnar conductors with the coil core interposed therebetween, and a plurality of first connecting members each integrally provided with, and of the same metal material as, the corresponding pair of the first and second columnar conductors to connect first ends of the corresponding pair of the first and second columnar conductors in the insulating layer, the first ends being opposite the first multilayer insulating layer, and the first and second columnar conductors are exposed at second ends thereof to the second principal surface of the insulating layer facing the first multilayer insulating layer; and the substrate-side coil electrode includes a plurality of second connecting members each configured to connect the second end of the corresponding first columnar conductor and the second end of the second columnar conductor adjacent on one side to the second columnar conductor paired with the corresponding first columnar conductor.

6. The coil module according to claim 4, wherein the coil electrode includes a plurality of electrode groups helically wound with different coil diameters around the coil core, and the electrode group with a small coil diameter is disposed inside the electrode group with a large coil diameter to constitute the coil electrode in a multi-winding structure.

7. The coil module according to claim 6, wherein the coil electrode comprises a first electrode group having a predetermined coil diameter and a second electrode group having a smaller coil diameter than the first electrode group;

the first connecting members of the first electrode group and the first connecting members of the second electrode group are alternately arranged in plan view; and wiring lengths of respective turns in the first electrode group are substantially the same, and the first and second columnar conductors of the first electrode group are individually arranged in a staggered manner.

8. The coil module according to claim 3, wherein the coil has the coil core with a toroidal shape; and the first columnar conductors are arranged on an outer side, which is the first side of the core, along an outer periphery of the coil core, and the second columnar conductors are arranged on an inner side, which is the second side of the core, along an inner periphery of the coil core.

9. The coil module according to claim 3, wherein each of the first and second columnar conductors is a metal pin.

10. The coil module according to claim 1, wherein the substrate-side coil electrode comprises connected-via conductors each comprising a plurality of via conductors in a planar direction of the wiring substrate such that the plurality of via conductors partly overlap each other.

11. The coil module according to claim 1, further comprising other components mounted on the wiring substrate.

12. The coil module according to claim 1, further comprising a plurality of third columnar conductors embedded in the insulating layer, exposed at first ends thereof from the insulating layer as external connection terminals, and connected at second ends thereof to the wiring substrate.

13. The coil module according to claim 5, wherein the coil electrode includes a plurality of electrode groups helically wound with different coil diameters around the coil core, and the electrode group with a small coil diameter is disposed inside the electrode group with a large coil diameter to constitute the coil electrode in a multi-winding structure.

14. The coil module according to claim 4, wherein the coil has the coil core with a toroidal shape; and the first columnar conductors are arranged on an outer side, which is the first side of the core, along an outer periphery of the coil core, and the second columnar conductors are arranged on an inner side, which is the second side of the core, along an inner periphery of the coil core.

15. The coil module according to claim 5, wherein the coil has the coil core with a toroidal shape; and the first columnar conductors are arranged on an outer side, which is the first side of the core, along an outer periphery of the coil core, and the second columnar conductors are arranged on an inner side, which is the second side of the core, along an inner periphery of the coil core.

16. The coil module according to claim 6, wherein the coil has the coil core with a toroidal shape; and the first columnar conductors are arranged on an outer side, which is the first side of the core, along an outer periphery of the coil core, and the second columnar conductors are arranged on an inner side, which is the second side of the core, along an inner periphery of the coil core.

17. The coil module according to claim 7, wherein the coil has the coil core with a toroidal shape; and the first columnar conductors are arranged on an outer side, which is the first side of the core, along an outer periphery of the coil core, and the second columnar conductors are arranged on an inner side, which is the second side of the core, along an inner periphery of the coil core.

18. The coil module according to claim 4, wherein each of the first and second columnar conductors is a metal pin.

19. The coil module according to claim 5, wherein each of the first and second columnar conductors is a metal pin.

20. The coil module according to claim 6, wherein each of the first and second columnar conductors is a metal pin.

* * * * *